(12) United States Patent
Shoji et al.

(10) Patent No.: US 7,807,498 B2
(45) Date of Patent: Oct. 5, 2010

(54) SUBSTRATE, SUBSTRATE FABRICATION, SEMICONDUCTOR DEVICE, AND SEMICONDUCTOR DEVICE FABRICATION

(75) Inventors: Masanobu Shoji, Tsuruoka (JP); Toru Fujita, Tsuruoka (JP)

(73) Assignee: Seiko Epson Corporation, Tokyo (JP)

( * ) Notice: Subject to any disclaimer, the term of this patent is extended or adjusted under 35 U.S.C. 154(b) by 16 days.

(21) Appl. No.: 12/170,943

(22) Filed: Jul. 10, 2008

(65) Prior Publication Data
US 2009/0032943 A1 Feb. 5, 2009

(30) Foreign Application Priority Data
Jul. 31, 2007 (JP) ............................. 2007-199566

(51) Int. Cl.
*H01L 21/00* (2006.01)
(52) U.S. Cl. .................. 438/106; 438/108; 438/426; 438/113; 438/401; 438/114; 257/797; 257/343; 257/165
(58) Field of Classification Search .................. 438/106, 438/626, 6, 121, 125, 599, 108, 110, 114, 438/113, 400; 257/700, 703, 723, 797, 343, 257/165, 341
See application file for complete search history.

(56) References Cited

U.S. PATENT DOCUMENTS

| | | | | |
|---|---|---|---|---|
| 6,483,195 | B1 * | 11/2002 | Aoki et al. | 257/778 |
| 2003/0218250 | A1 * | 11/2003 | Kung et al. | 257/737 |
| 2004/0152234 | A1 * | 8/2004 | Usui et al. | 438/106 |
| 2005/0124091 | A1 * | 6/2005 | Fukase et al. | 438/106 |
| 2005/0166842 | A1 * | 8/2005 | Sakamoto | 118/721 |
| 2006/0021734 | A1 * | 2/2006 | Chang et al. | 165/80.3 |
| 2009/0072391 | A1 * | 3/2009 | Kolan et al. | 257/737 |

FOREIGN PATENT DOCUMENTS

| JP | A-2-240940 | 9/1990 |
|---|---|---|
| JP | A-2004-281486 | 10/2004 |

* cited by examiner

*Primary Examiner*—William M Brewster
*Assistant Examiner*—Wilner Jean Baptiste
(74) *Attorney, Agent, or Firm*—Oliff & Berridge PLC

(57) ABSTRACT

A substrate for fixing an integrated circuit (IC) element comprises: a substrate for fixing an integrated circuit element includes: a plurality of metal posts that are aligned in a longitudinal direction and a lateral direction in plan view, each of the plurality of metal posts having a first surface and a second surface facing an opposite direction to the first surface, the plurality of metal posts being configured identically; and a joining section that joins each of the plurality of metal posts together at a portion of each of the plurality of metal posts between the first surface and the second surface.

17 Claims, 21 Drawing Sheets

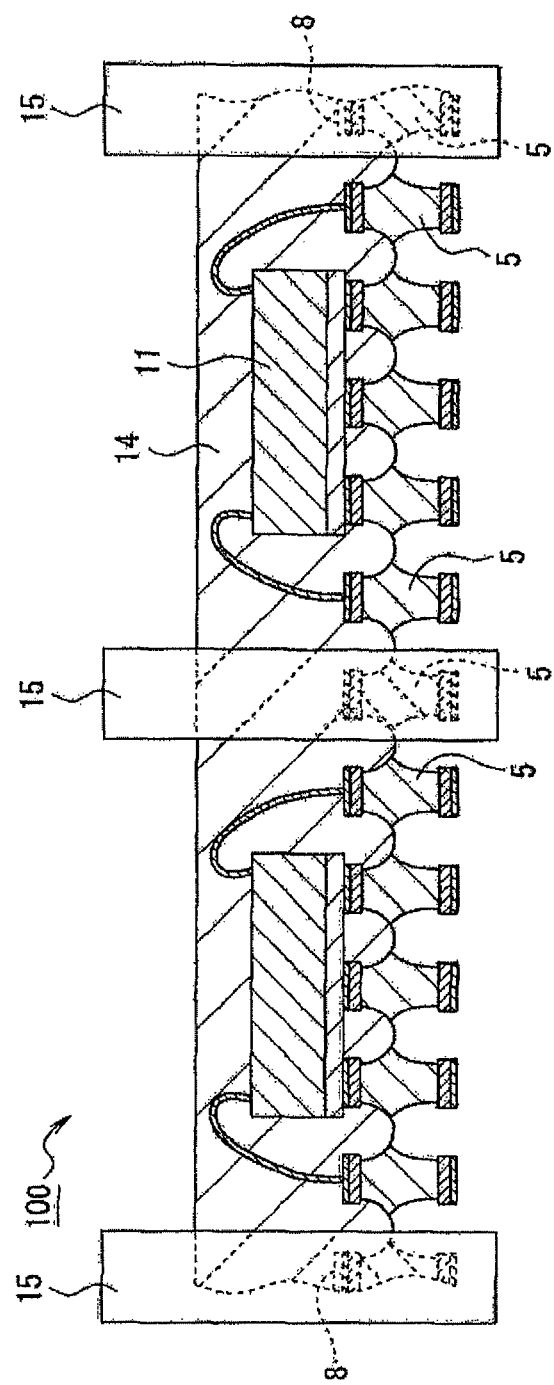
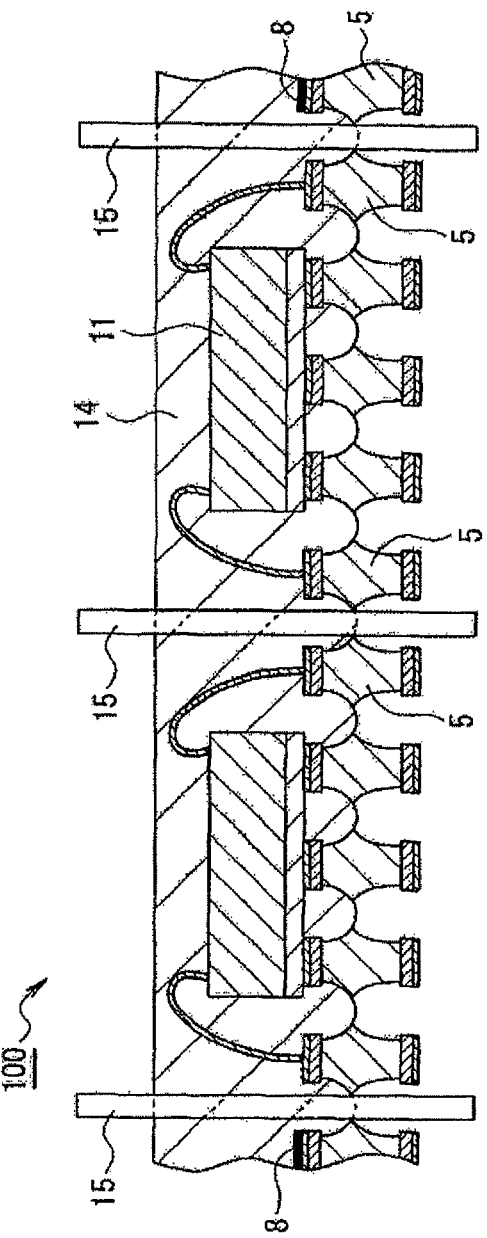
FIG. 4A
FIG. 4B

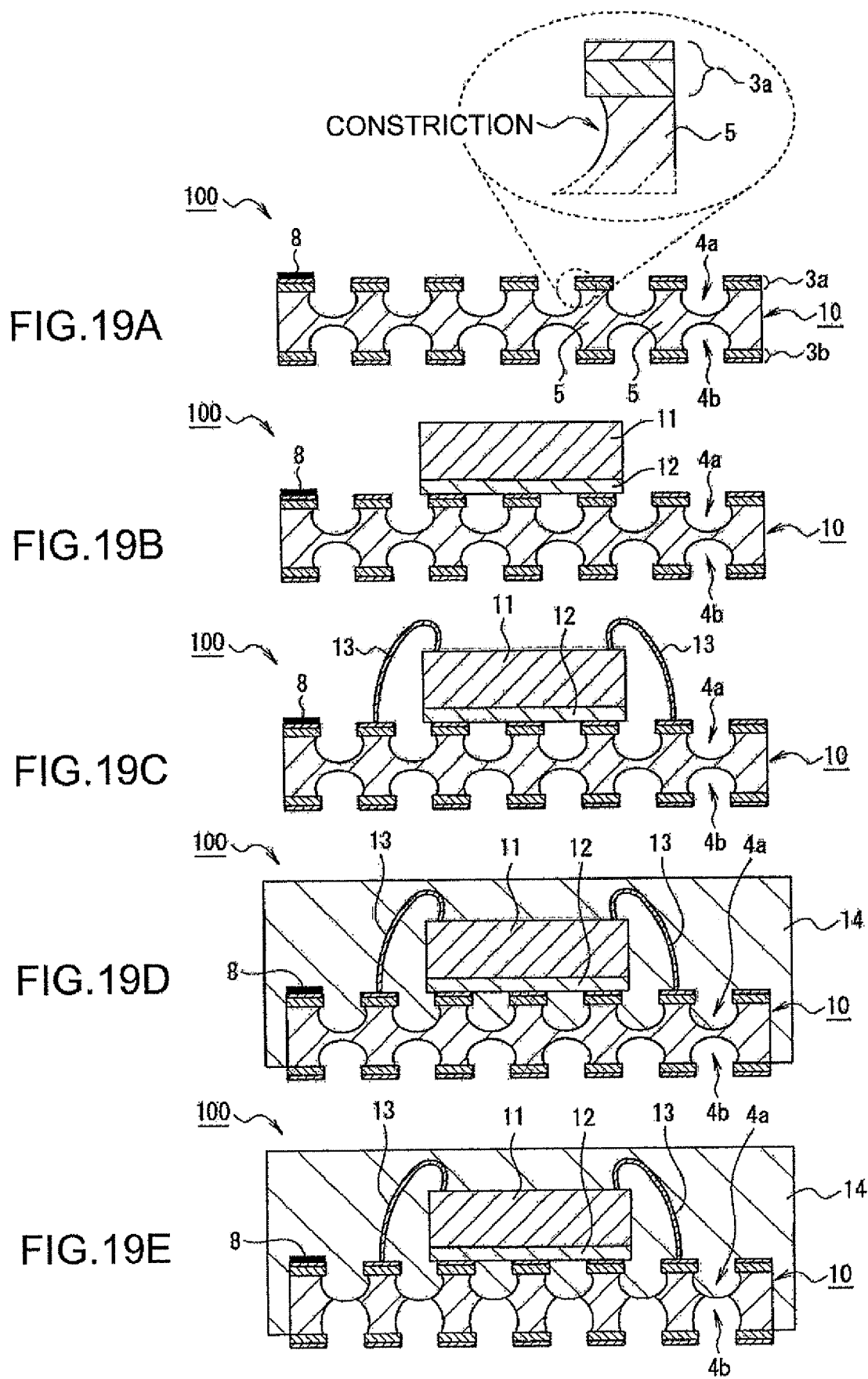

SUBSTRATE, SUBSTRATE FABRICATION, SEMICONDUCTOR DEVICE, AND SEMICONDUCTOR DEVICE FABRICATION

The entire disclosure of Japanese Patent Application No, 2007-199566, filed Jul. 31, 2007 is expressly incorporated by reference herein.

BACKGROUND

1. Technical Field

The present invention relates to a substrate, a method for fabricating a substrate, a semiconductor device, and a method for fabricating a semiconductor device.

2. Related Art

Semiconductor packages are roughly classified into peripheral type packages and area type packages. A peripheral type package is a package in which the external terminals are arranged on the periphery of the package, and an area type package is a package in which the external terminals are arranged on the lower surface of the package. FIGS. 20A through 20C show typical peripheral type packages called a dual in-line package (DIP), a small out-line package (SOP), and a quad flat package (QFP). The peripheral type package, as shown in FIG. 20D, includes an integrated circuit (IC) element 210 mounted on a chip-mounting section called a die pad 201. Electrodes on the IC element 210 and leads 203 of a lead frame are coupled by e.g. gold wires. Then, these elements, not including peripheral portions of the leads 203, are sealed with resin. Portions of the leads 203 inside the resin package are called internal terminals, and portions of the leads 203 outside the resin package are called external terminals.

The area type package, with reference to FIGS. 21A and 21B and FIGS. 22A and 22B, is a package represented by a ball grid array (BGA) package which is fabricated by mounting the IC element 210 on a substrate 211, electrically coupling the IC element 210 to the substrate 211 with either gold wires, solder, or gold bumps, and sealing the elements such as the IC element 210 with resin. Referring to FIGS. 21A and 21B, the package in which the substrate 211 is coupled to the IC element 210 with gold wires 213 is called a gold wire BGA package.

Also, a package with reference to FIGS. 22A and 22B is called a bump BGA package in which the substrate 211 is coupled to the IC element 210 with bumps 223. FIGS. 22A and 22B, in particular, show a type of bump BGA that is not sealed with resin. As shown in FIGS. 21A through 22B, the external terminals of the area type are not the leads but electrodes 225 (or solder balls 19) mounted on the rear surface of the substrate 211.

Manufactured also in recent years is a package, with reference to FIGS. 23A through 23I, which is fabricated by: electroplating columnar-shaped terminals 233 and an columnar-shaped die pad 235 on a metal plate 231, mounting the IC element 210 on the die pad 235, coupling the IC element 210 to the terminals 233 with the gold wires 213, conducting resin sealing, peeling off the metal plate 231 from a resin-formed portion 236, and dicing into each separate product.

More specifically, with reference to FIGS. 23A and 2313, a resist is first coated on the metal plate 231, and the coated metal plate 231 is subjected to exposure and development to form a resist pattern 237. Then, referring to FIG. 23C, copper or the like is electroplated on the surface of the metal plate 231 that is exposed at the lower part of the resist pattern 237 so as to form the columnar shaped terminals 233 and die pad 235. Thereafter, referring to FIG. 23D, the resist pattern is removed. Then, with reference to FIG. 23E, the IC element 210 is mounted on the die pad 235 through electroplating, followed by wire bonding. Then, with reference to FIG. 23F, the IC element, gold wires 213, etc. are sealed with resin. Referring to FIG. 23G, the metal plate 231 is then peeled off from the resin-formed portion 236. Thereafter, referring to FIGS. 23H and 23I, the resin-formed portion 236 is diced into each separate product, and the package is thereby produced.

JP-A-2-240940 discloses a technique in which a peripheral type package is fabricated by: half-etching one surface of a support of a tabular lead frame, mounting an IC element on a die pad of the lead frame, conducting wire bonding and resin sealing, and thereafter removing the support by polishing the other surface of the support whose one surface has been half-etched, thereby fabricating the peripheral type package. Disclosed in JP-A-2004-281486 is a technique intended to enhance versatility of the area type package by radially arranging the wires from the center of the substrate to outside in plan view.

In the related art techniques, the peripheral type packages, the area type packages, the package referring FIGS. 23A through 23I, and the package described in JP-A-2-240940 all require a die pad as an IC element-mounting plane or a substrate such as an interposer. Therefore, depending on the size of the IC element and the number of external outputs from the IC element (i.e., the number of leads or balls), these packages need specific lead frames or specific substrates, or specific photomasks (to form the columnar shapes). In particular, in order to produce large item small volume products, a large number of lead frames or substrates or photomasks need be secured, and this has been a setback in reducing the production costs.

Also, in JP-A-2004-281486, an area type package that accommodates all chip sizes is accomplished by radially arranging the wires from the center of the substrate to outside. However, in this technology, it is necessary to arrange the pad terminals of the IC element so as to always overlap planarly with the wires that extend radially from the substrate center. Therefore, there is less degree of freedom of design in laying out the pad terminals. In other words, although the versatility of the package improves, restrictions placed on the IC element increases as well.

SUMMARY

An advantage of some aspects of the invention is to provide a substrate, a substrate fabrication method, a semiconductor device, and a semiconductor device fabrication method which allow common application of a specification of a wiring board for mounting an IC element, without placing additional restrictions on the IC element.

According to a first aspect of the invention, a substrate for fixing an integrated circuit element includes: a plurality of metal posts that are aligned in a longitudinal direction and a lateral direction in plan view, each of the plurality of metal posts having a first surface and a second surface facing an opposite direction to the first surface, the plurality of metal posts being configured identically; and a joining section that joins each of the plurality of metal posts together at a portion of each of the plurality of metal posts between the first surface and the second surface.

In this case, the "first surface" of some aspects of the invention is a surface on a side to be coupled to a pad terminal of the IC element, for example, and the "second surface" is a surface on a side of each metal post to be coupled to a motherboard, for example. Also, the "portion" of some aspects of the invention may either be a middle portion between the first and second surfaces or a portion between the middle portion and the second surface, including the second surface. If the "portion" of some aspects of the invention includes the second surface, the "joining section" is formed between the middle portion and the second surface. For example, the joining section may be formed so that the lower surface of the joining section becomes the same surface as the second surface.

In a semiconductor device fabrication process, for example, the IC element may be fixed on the first surface of a first metal post, and the first surface of a second metal post may be coupled to the pad terminals of the IC element. Then, the IC element, conductive members, and portions on the side adjacent to the first surfaces of the metal posts may all together be sealed with resin. Then, the joining portions are etched from the side adjacent to the second surface of the substrate and removed so that the metal posts are electrically cut off from each other.

Because all of the metal posts of the substrate of the first aspect of the invention have an identical configuration, all of them may be used as die pads for mounting the IC element, or the plurality of them may be used as external terminals of the IC element. Depending on the configuration and size of an IC fixing region established as desired, the plurality of metal posts may be used either as the die pads or the external terminals. Accordingly, it is not necessary to prepare a specific die pad, a specific lead frame, or a specific substrate (e.g., interposer) per each kind of IC element when assembling a semiconductor device. It is possible to commonly apply the specification of the substrate used for element mounting and as the external terminals, without restricting the layout (arrangement position) of the pad terminals of each kind of IC element. As a result, the costs of producing substrates may be reduced.

It is preferable that, in the substrate of the first aspect of the invention, the joining section be made of a same material as that of the metal posts.

It is preferable that, in the substrate of the first aspect of the invention, the plurality of metal posts be in an identical size.

It is also preferable that, in the substrate of the first aspect of the invention, a side surface of each of the plurality of metal posts be cross-sectionally curved. Having such a structure, as compared to a structure in which the side surface of each metal post is not curved (i.e., the side surface of the metal post is perpendicular to both first and second surfaces), it is possible to increase the area of contact between the resin and the side surfaces of the metal posts and to enhance the bond between the resin and the metal posts at a time of, for example, resin-sealing the elements such as the IC element. Such a substrate may therefore contribute to prevention of falling of the metal posts after sealed with resin.

It is preferable that, in the substrate of the first aspect of the invention, each of the plurality of metal posts be cross-sectionally constricted. A term "constricted" here indicates a configuration that is narrowed down at the center.

In this case, when the portions of the metal posts on the side adjacent to the first surface and the like are sealed with resin, for example, the constricted configuration clutches the first resin, thereby producing an anchor effect. Such a substrate may therefore contribute to prevention of falling of the metal posts after sealed with resin.

It is preferable that the substrate according to the first aspect of the invention further include a first plated layer provided the first surface of each of the plurality of metal posts, in that the first plated layer protrudes outside the first surface.

In this case, the first plated layer and the metal post together form a shape that looks like the letter "T" in sectional view. When sealing the portions of the metal posts on the side adjacent to the first surface, this letter T catches the resin. Therefore, the anchor effect may be produced by the letter T, and the metal posts may be prevented from falling after sealed with resin.

According to a second aspect of the invention, a method for fabricating a substrate for fixing an integrated circuit element includes: providing a plurality of metal posts aligned in a longitudinal direction and a lateral direction in plan view, by partially etching a metal plate from at least a first surface of the metal plate which has a second surface facing an opposite direction to the first surface. In the method, the etching is conducted so that all the plurality of metal posts are configured identically and that the plurality of metal posts are joined together between the first and second surfaces.

The method according to the second aspect of the invention enables fabrication of the substrate of the first aspect of the invention.

It is preferable that the substrate fabrication method according to the second aspect of the invention further include: providing a first plated layer in a first region of the first surface prior to the forming of the plurality of the metal posts, and the plurality of metal posts are provided in the forming of the plurality of the metal postsby wet etching the metal plate from the first surface using the first plated layer as a mask.

In this case, the "first plated layer" and a "second plated layer" of some aspects of the invention may take a single layer structure or a multilayer structure. Also, the "first plated layer" and the "second plated layer" may have the same structure or different structures. To express the multilayer structure in the order of lower layer/middle layer/upper layer, each of the "first plated layer" and the "second plated layer" is Ni/Pd/Au, Ni/Au, or Ag, for example.

The fabrication method according the second aspect of the invention allows fabrication of the substrate such that the side surface of the metal post is cross-sectionally curved. Additionally, the wet etching of the metal plate may be done by spray type wet etching. The spray type etching promotes etching in the depth direction if the spraying angle of an etchant is set perpendicular to the surface of the metal plate, and promotes etching in the lateral direction (i.e., side etching) if the spraying angle is set diagonal to the surface of the metal plate. Moreover, by increasing the spraying pressure of the etchant, the etching speed may increase. Therefore, it is possible to form the side surface of each metal post into the sectionally constricted configuration (i.e., narrowed down at the center) by, for example, spray etching the metal plate while adjusting the spraying angle and pressure against the surface of the metal plate. As a consequence, the method also allows fabrication of the substrate such that the metal post is sectionally constricted.

It is preferable that the substrate fabrication method according to the second aspect of the invention further include: providing a second plated layer in a second region of the second surface prior to the forming of the plurality of metal posts, and the plurality of metal posts are provided in the forming of the plurality of metal posts by wet etching the metal plate from the first surface using the first plated layer as the mask and from the second surface using the second plated layer as a mask.

It is preferable that, in the substrate fabrication method according to the second aspect of the invention, the metal plate is wet etched, in the forming of the plurality of metal posts, from the first surface under a condition that the metal plate is more readily etched than the first plated layer In this case, if the "first plated layer" of some aspects of the invention is composed of e.g. Ni/Pd/Au, Ni/Au, or Ag, and if the "metal plate" is made from a copper plate, the wet etching using a ferric chloride solution or an alkaline solution (hereunder referred to as alkaline etchant) may be employed as an example of "a condition in which the first plated layer is more readily etched than the metal plate."

By this method, it is possible to subject the metal plate to isotropic etching using the first plated layer as a mask and to narrow down each metal post located directly under the first plated layer. That is, because the first plated layer may protrude outside the first surface of the metal post, it is possible to produce the substrate of the first aspect of the invention.

According to a third aspect of the invention, a semiconductor device includes: a plurality of metal posts that are aligned in a longitudinal direction and a lateral direction in plan view, each of the plurality of metal posts having a first surface and a second surface facing an opposite direction to the first surface, the plurality of metal posts having a first metal post and a second metal post; an integrated circuit element that is fixed on the first surface of the first metal post; a first conductive member that couples the first surface of the second metal post to a pad terminal of the integrated circuit element; and a first resin that seals the integrated circuit element, the first conductive member, and a part of the plurality of metal posts. The second surface of the plurality of metal posts is exposed from the first resin, and a side surface of each of the plurality of metal posts is cross-sectionally curved.

If the "pad terminal" and the "second metal post" of some aspects of the invention are electrically coupled by wire bonding, the "first conductive member" is a gold wire, for example. If this coupling is conducted by face-down bonding, the "first conductive member" is a stud bump made of e.g. gold. The layout interval (pitch) between the stud bumps is, for example, an integral multiplication of the pitch between the metal posts.

With the semiconductor device of the third aspect of the invention, it is possible to use the plurality of metal posts as the die pads for mounting the IC elements or the external elements of the IC elements and to use the plurality of metal posts either as the die pads or the external terminals depending the configuration and the size of the IC fixation region that are established as desired. Therefore, it is not necessary to prepare a specific die pad, a specific lead frame, or a specific substrate (e.g., interposer) per each kind of the IC element when assembling the semiconductor device. It is possible to commonly apply the specification of the substrate used for element mounting and as the external terminals, without restricting the layout (arrangement position) of the pad terminals of each kind of IC element. As a result, the costs of producing the semiconductor device may be reduced.

Also, with the semiconductor device of the third aspect of the invention, metals are not gathered at one place unlike the die pads of the related art. Because the metal posts functioning as the die pads or the external terminals are distributed within the resin package, it is possible to decentralize the locations of moisture aggregation and to reduce concentration of water vapor pressure. Therefore, it is possible to suppress cracking of the resin package during a reliability test associated with moisture absorption and heating, and to thereby enhance the reliability of the semiconductor device.

Moreover, with the semiconductor device of the third aspect of the invention, the side surfaces of the plurality of metal posts are cross-sectionally curved. This may increase the area of contact between the first resin and the side surfaces of the metal posts, as compared to when the side surfaces are not curved (that is, the side surfaces of the metal posts are perpendicular to the first and second surfaces) and, thus, increase the bond between the first resin and the metal posts. As a result, falling of the metal posts from the first resin may be prevented.

It is preferable that, with the semiconductor device of the third aspect of the invention, each of the plurality of metal posts is cross-sectionally constricted. In this case, because the constricted configuration clutches the first resin, the anchor effect may be produced, and the metal posts may be prevented from falling from the first resin.

It is preferable that the semiconductor device of the third aspect of the invention further includes a first plated layer that is provided on the first surface of each of the plurality of metal posts.

In this case, the first plated layer and the metal posts together form a shape that looks like the letter "T" in sectional view, and it is this letter T that catches the first resin. Therefore, the anchor effect may be produced by the letter T, and the metal posts may be prevented from falling from the first resin.

It is preferable that the semiconductor device of the third aspect of the invention further includes a second resin that seals a portion of the plurality of metal posts, the portion being exposed from the first resin. Each of the plurality of metal posts includes, between the first and second surfaces, a first portion having a first width and a second portion having a second width that is cross-sectionally wider than the first width, and the second portion is cross-sectionally interposed between the first and second resins.

In this case, because the second portion is interposed and fixed between the first and second resins, the metal posts may be prevented from falling from the first resin.

It is preferable that semiconductor device of the third aspect of the invention further include: a second plated layer that is provided on the second surface of each of the plurality of metal posts; and a second conductive member that is provided over part of the second plated layer. The second resin covers a periphery of the second plated layer, and the second conductive member covers a portion of the second resin covering the periphery of the second plated layer.

In this case, because the metal posts having the second plated layers formed thereon may be held by the second resin, and because this second resin may be held by the second conductive member, it is possible to prevent the metal posts from falling from the first resin.

It is preferable that semiconductor device of the third aspect of the invention further include: a motherboard that is coupled to each of the plurality of metal posts; and a third resin sealing, between the first resin and the motherboard, the portion of each of the plurality of metal posts that is exposed from the first resin. In this case, the "substrate" of some aspects of the invention is a substrate for primary packaging, and the "motherboard" is a substrate for secondary packaging.

With the semiconductor device of the third aspect of the invention, it is possible to increase the reliability of connection between the IC elements and the motherboard.

It is preferable that semiconductor device of the third aspect of the invention further include: a third metal post and a fourth metal post that are included in the plurality of metal posts; a passive component that is fixed on the first surface of the third metal post; and a third conductive member that coupls the fourth metal post on the first surface to a terminal section of the passive component. The first resin seals the passive component and the third conductive member.

In this case, similarly to the first and second metal posts, the third and fourth metal posts may also be prevented from falling.

According to a fourth aspect of the invention, a method for fabricating a semiconductor device includes: (a) providing a plurality of metal posts aligned in a longitudinal direction and a lateral direction in plan view, by partially etching a metal plate from at least a first surface of a metal plate having a second surface facing an opposite direction to the first surface, and the etching is conducted so that the plurality of metal posts are configured identically and joined together between the first and second surfaces by joining sections; (b) fixing an integrated circuit element on the first surface of a first metal post of the plurality of metal posts; (c) coupling a second metal post of the plurality of metal posts to a pad terminal of the integrated circuit element using a first conductive member; (d) sealing the integrated circuit element, the first conductive member, and a portion of the plurality of metal posts on a side adjacent to the first surface with a first resin; and (e) removing the joining sections by etching from the second surface after the sealing of the integrated circuit element.

In this case, if the IC element is to be fixed to the substrate by face-down bonding, in particular, the IC element should be designed so that the pitch between the pad terminals (e.g., gold stud bumps or solder bumps) of the IC element becomes the integral multiplication of the pitch of the metal posts.

The fabrication method of the fourth aspect of the invention enables fabrication of the semiconductor device of the third aspect of the invention.

The term "first resin" of some aspects of the invention is a mold resin, for example, and the "second resin" is a solder resist, for example. Also, the "third resin" is an underfill. If the expansion rates of the mold resin, the solder resin, and the underfill are $\alpha 1$, $\alpha 2$, and $\alpha 3$, respectively, the magnitude relation among them is $\alpha 1 < \alpha 3 < \alpha 2$, for example. The smaller the expansion rate is, the more expandable the resin is. In other words, the mold resin is not as expandable than the solder resist or the underfill. Additionally, if the elasticity modulus of the mold resin, the solder resist, and the underfill are $1\beta$, $2\beta$, and $3\beta$, respectively, the magnitude relation among them is $1\beta > 3\beta > 2\beta$, for example. The smaller the elasticity modulus is, the more elastic the resin is, and the larger the elasticity modulus is, the harder the resin is. In other words, the mold resin is harder than the solder resist or the underfill.

BRIEF DESCRIPTION OF THE DRAWINGS

The invention will be described with reference to the accompanying drawings, wherein like numbers reference like elements.

FIGS. 4A and 4B are diagrams showing a dicing step according to the first embodiment.

FIGS. 19A through 19E are diagrams showing another example of the side surface configuration of a post 5.

DESCRIPTION OF EXEMPLARY EMBODIMENTS

Embodiments of the invention will now be described with reference to the accompanying drawings.

1. First Embodiment

In the first embodiment, a substrate fabrication method will be described first. Then, a method for fabricating a semiconductor device by mounting an integrated circuit (IC) element onto this substrate will be described. In the first embodiment, two fabrication techniques will be described with reference to FIGS. 1A through 1F and 2A through 2G to exemplify the substrate fabrication method. FIGS. 1A through 1F illustrate the fabrication method employing a semi-additive technique, and FIGS. 2A through 2G illustrate the fabrication method employing a subtractive technique. Description of these two techniques is followed by descriptions of processes of mounting the IC element and resin sealing with reference to FIGS. 3A through 3E and of a dicing process with reference to FIGS. 4A and 4B.

Figure 1A:
FIGS. 1A through 1F are diagrams showing a method for fabricating a substrate 10 according to a first embodiment.
Figure 1B:
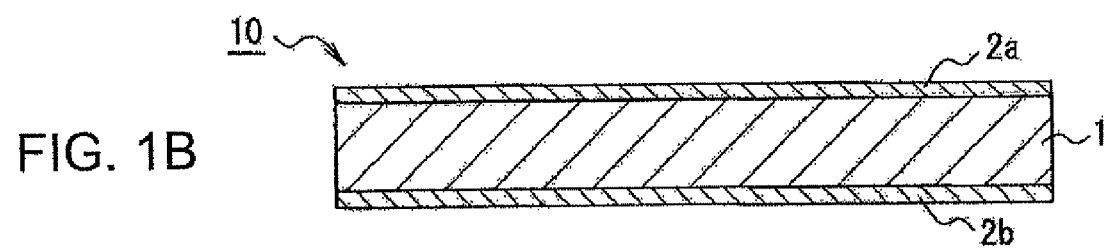

FIGS. 1A through 1F are sectional diagrams showing the method (semi-additive technique) for fabricating a substrate 10 according to the first embodiment of the invention. First, a copper plate 1 with reference to FIG. 1A is prepared. The vertical and horizontal sizes of the copper plate 1 in plan view may be any sizes larger than the dimensional outline of a package of the semiconductor device made from the copper plate 1. The thickness of the copper plate 1 is about 0.10 to 0.30 mm, for example. Then, referring to FIG. 1B, photoresists 2a and 2b are coated on a front surface and a rear surface of the copper plate 1, respectively. The photoresists 2a and 2b may be of positive type or negative type, for example.

Figure 1C:
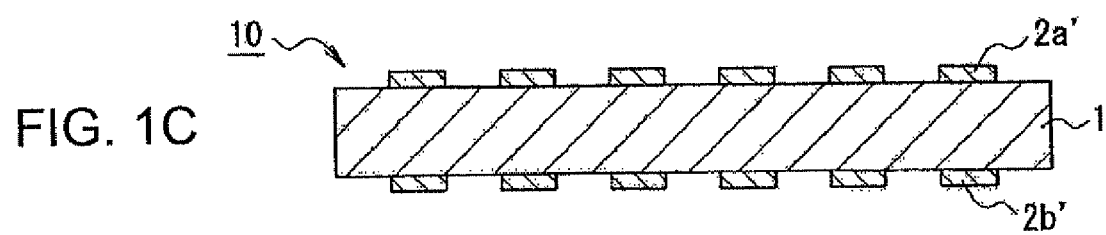

Then, referring to FIG. 1C, the photoresists are subjected to exposure and development so as to expose regions for forming a plurality of cylindrical electrodes (hereunder referred to as posts) and to form resist patterns 2a' and 2b' over the remaining regions. In this case, the resist patterns 2a' is formed on the front surface of the copper plate 1, while the resist pattern 2b' is formed on the rear surface of the copper plate 1.

Figure 1D:
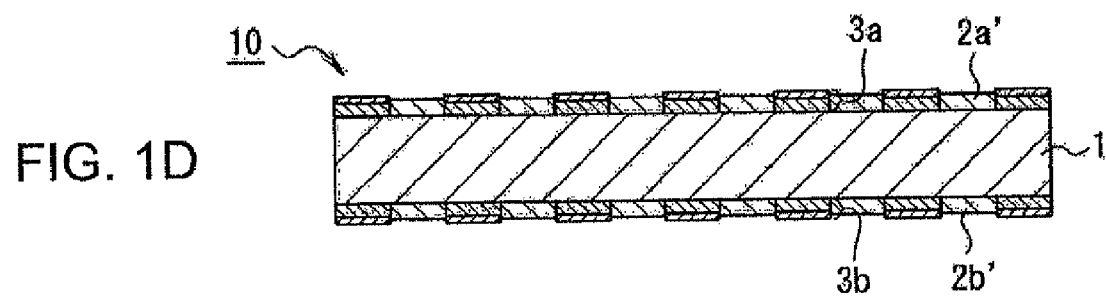

Then, referring to FIG. 1D, plated layers 3a and 3b are provided by e.g. electrolytic plating in the regions exposed from the resist patterns 2a' and 2b' (i.e., the regions for forming the posts). In this case, the plated layer 3a is formed on the front surface of the copper plate 1, while the plated layer 3b is formed on the rear surface of the copper plate 1.

Referring to FIG. 1D, both of the plated layers 3a and 3b have a double layer structure. However, the plated layers 3a and 3b may have a multilayer structure with more than two layers or a single layer structure. For example, the plated layers 3a and 3b may employ either a triple layer structure composed of Ni (lower layer)/Pd (middle layer)/Au (upper layer), a double layer structure composed of Ni (lower layer)/Au (upper layer), or a single structure made of Ag. If the plated layers 3a and 3b employ any of these structures, it is preferable that the Ni layer or the Ag layer be made into a thick layer.

Figure 1E:
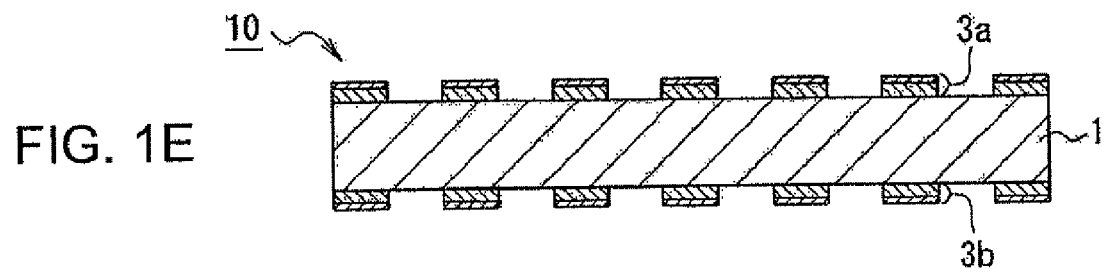

Thereafter, referring to FIG. 1E, the resist patterns are removed from the front and rear surfaces of the copper plate 1. Then, referring to FIG. 1F, the copper plate 1 is etched from the side adjacent to the front surface using the plated layer 3a as a mask to provide recesses 4a, while it is also etched from the side adjacent to the rear surface using the plated layer 3b as a mask to provide recesses 4b. In this case, the copper plate 1 is half-etched from both the front and rear surfaces to form a plurality of posts 5, while simultaneously forming joining sections 6 for horizontally joining these posts 5 together in sectional view. That is, the etching is stopped before the copper plate 1 between the plurality of posts 5 is completely etched and disappeared (i.e., before penetrated). Produced by this half etching is the substrate 10 having the posts that are joined to each other at portions between the front surface and the rear surface of the copper plate 1.

Figure 1F:
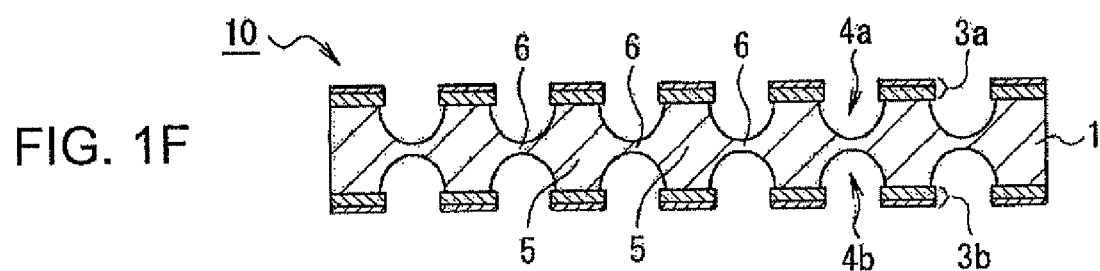

Referring to FIG. 1F, the half etching of the copper plate 1 is conducted by dip type or spray type wet etching. The etchant used is a ferric chloride solution or an alkaline etchant (hereunder referred to as alkaline solution), for example.

If the plated layers 3a and 3b are composed of, e.g., Ni/Pd/Au or Ni/Au, it is preferred to use the alkaline solution as the etchant. Since Ni is not readily dissolved in alkaline solution, the plated layers 3a and 3b are left unetched and protrude outside from both front and rear surfaces of the posts 5, with reference to FIG. 1F. Similarly, if the plated layers 3a and 3b are made of e.g. Ag, it is preferred to use the ferric chloride solution as the etchant. Since Ag is not readily dissolved in ferric chloride solution, the plated layers 3a and 3b are left unetched and protrude outside from both front and rear surfaces of the posts 5, with reference to FIG. 1F.

The recesses 4a and 4b to be provided on the respective front and rear surfaces of the copper plate 1 may be formed in an identical depth or different depths. For example, if the recesses 4a and 4b are to be formed by the spray type wet etching, the time for etching the front surface is set twice the time for etching the rear surface. As a consequence, the recesses 4a are formed in a depth of e.g. 0.1 mm on the front surface, and the recesses 4b are formed in a depth of e.g. 0.05 mm on the rear surface.

In the half etching process with reference to FIG. 1F, there is a case in which the surface of the copper plate 1 exposed by use of the etchant is darkened from oxidation. Thus, after the half etching, the substrate 10 may be rinsed to remove the oxidized and darkened layer. By this rinsing treatment, the oxidized layer is removed from the exposed surface of the copper plate 1, and the copper plate 1 restores gloss. Additionally, after the rinsing treatment, the exposed surface of the copper plate 1 may be coated with an antioxidant. This prevents oxidation of the copper plate 1 in assembling processes that follow hereafter.

Before etching the copper plate 1, referring to FIG. 1E, a plate-protecting photoresist (not shown) may be additionally provided on the front and rear surfaces of the copper plate 1. Because the copper plate 1 is etched using, as a mask, the plated layers 3a and 3b covered by this photoresist, the plated layers 3a and 3b is protected from the etchant.

The plate-protecting photoresist may be left unremoved even after the recesses 4a and 4b have been provided. Thus, in the subsequent assembling processes, also, the plated layers 3a and 3b stay protected. The plate-protecting photoresist may be left unremoved on both of the plated layers 3a and 3b or only on the plated layer 3b. If the photoresist remains only on the plated layer 3b, the layer 3b can stay protected in the subsequent assembling process.

Also, this plate-protecting photoresist may be provided not before but after etching the copper plate 1. With such a composition, also, the plated layers 3a and 3b are kept protected even in the subsequent assembling processes.

The other technique for fabricating the substrate will be described with reference to FIGS. 2A through 2G.

FIGS. 2A through 2G are sectional diagrams showing the method (subtractive technique) for fabricating the substrate 10 according to the first embodiment of the invention. The constituting elements of FIGS. 2A through 2G that are identical to those of FIGS. 1A through 1F are allotted the same reference numbers, and explanations thereof will not be repeated.

Figure 2A:
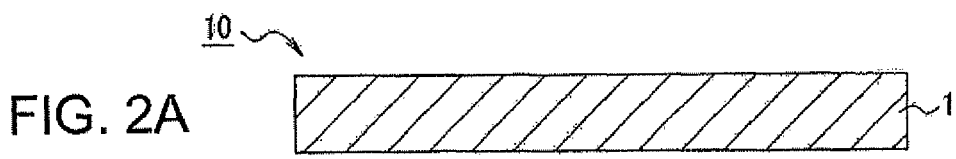
FIGS. 2A through 2G are diagrams showing the method for fabricating the substrate 10 according to the first embodiment.
Figure 2B:
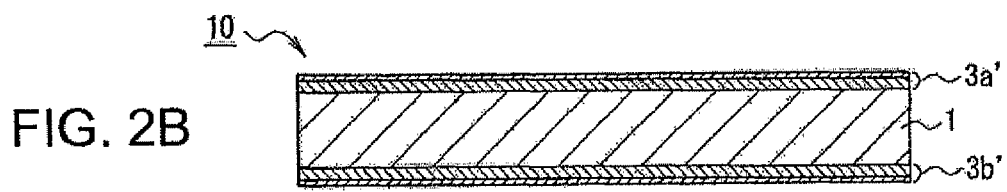

At first, referring to FIG. 2A, the copper plate 1 is prepared. Then, referring to FIG. 2B, plated layers 3a' and 3b' are provided by e.g. electrolytic plating on the front and rear surfaces of the copper plate 1, respectively. In FIG. 2B, similarly to FIGS. 1A through 1F both of the plated layers 3a' and 3b' also have the double layer structures. However, the plated layers 3a' and 3b' may have the multilayer structure with more than two layers or the single layer structure. For example, the plated layers 3a' and 3b' may employ either a multilayer structure composed of Ni (lower layer)/Pd (middle layer)/Au (upper layer), a double layer structure composed of Ni (lower layer)/Au (upper layer), or a single structure made of Ag. If the plated layers 3a' and 3b' take any of these structures, it is preferable that the Ni layer or the Ag layer be made into a thick layer.

Figure 2C:
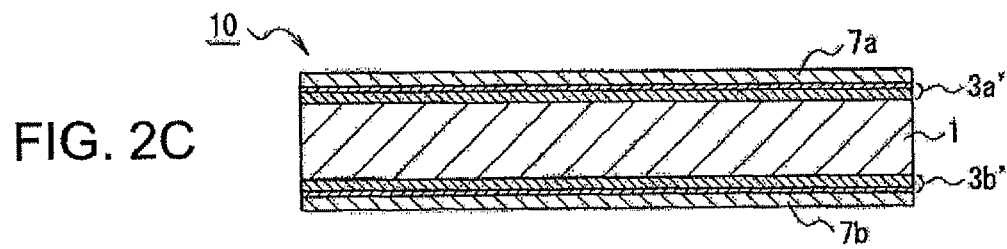

Next, with reference to FIG. 2C, the front and rear surfaces of the copper plate 1 are coated with photoresists 7a and 7b, respectively. Then, referring to FIG. 2D, the photoresists 7a and 7b are subjected to exposure and development so as to expose the regions for forming the posts, and resist patterns 7*a*' and 7*b*' are formed to cover the other regions. Thereafter, the plated layers 3*a*' and 3*b*' are etched using the resist patterns 7*a*' and 7*b*' as a mask and removed. As a result, referring to FIG. 2E, the patterned plated layers 3*a* and 3*b* are formed on the respective front and rear surfaces of the copper plate 1.

If the plated layers 3*a* and 3*b* are composed of Ni/Pd/Au or Ni/Au, aqua rigia is used for example as an etchant for etching the plated layers. If the plated layers 3*a* and 3*b* are made of Ag, nitric acid solution is used as the etchant, for example. After etching the plated layers, the copper plate 1 is etched, with reference to FIG. 2F, from both front and rear surfaces using, as a mask, the resist patterns 7*a*' and 7*b*' and the plated layers 3*a* and 3*b* covered by these resist patterns 7*a*' and 7*b*', respectively. As a result, the recesses 4*a* are formed on the front surface, and the recesses 4*b* are formed on the rear surface of the copper plate 1.

Figure 2D:
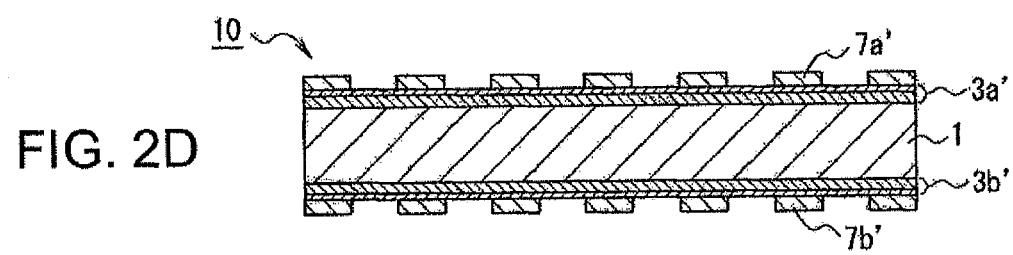
Figure 2E:
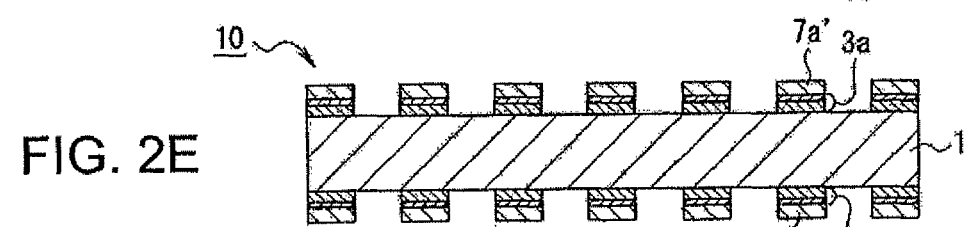
Figure 2F:
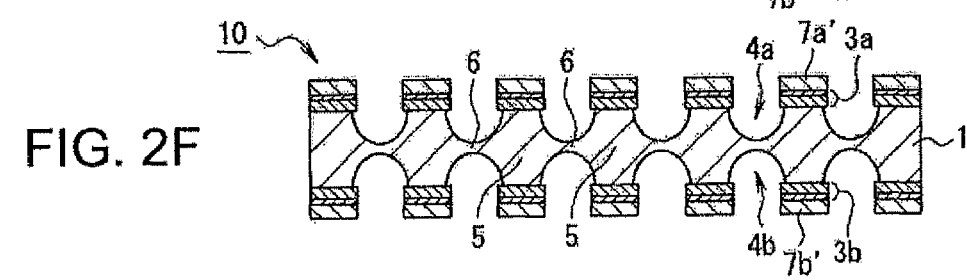

As in the fabrication method shown with reference to FIGS. 1A to 1F, in the fabrication method referring to FIGS. 2A through 2G, also, the copper plate 1 is half-etched from the front and rear surfaces so as to form the plurality of posts 5 while simultaneously forming the joining sections 6 for horizontally joining these posts 5 in sectional view. Specifically, the etching is stopped before the copper plate 1 between the plurality of posts 5 is completely etched and disappeared (i.e., before penetrated). Produced by this half etching is the substrate 10 having the posts that are joined to each other at the portions between the front surface and the rear surface of the copper plate 1, for example. The half etching of the copper plate 1, with reference to FIG. 2F, is conducted by dip type or spray type wet etching. The etchant used is a ferric chloride solution or an alkaline solution, for example.

If the plated layers 3*a* and 3*b* are composed of, e.g., Ni/Pd/Au or Ni/Au, it is preferable to use the alkaline solution as the etchant. If the plated layers 3*a* and 3*b* are made of e.g. Ag, it is preferable to use the ferric chloride solution as the etchant. By choosing the etchant, the plated layers 3*a* and 3*b* can be left unetched and protrude outside from the front and rear surfaces of the posts 5, with reference to FIG. 2F.

The recesses 4*a* and 4*b* provided on the respective front and rear surfaces of the copper plate 1 may have an identical depth or different depths. For example, if the recesses 4*a* and 4*b* are to be formed by the spray type wet etching as in the fabrication method with reference to FIGS. 1A through 1F, the time required for the wet etching may be adjusted in order to produce the recesses having a depth of e.g. 0.1 mm on the front surface, and the recesses having a depth of e.g. 0.05 mm on the rear surface. As in the method with reference to FIGS. 1A through 1F, after providing these recesses 4*a* and 4*b*, the oxidized and darkened layer may be removed by rinsing the substrate 10. This restores gloss of the copper plate 1. Additionally, after the rinsing treatment, the exposed surface of the copper plate 1 may be coated with an antioxidant. This prevents oxidation of the copper plate 1.

Figure 2G:
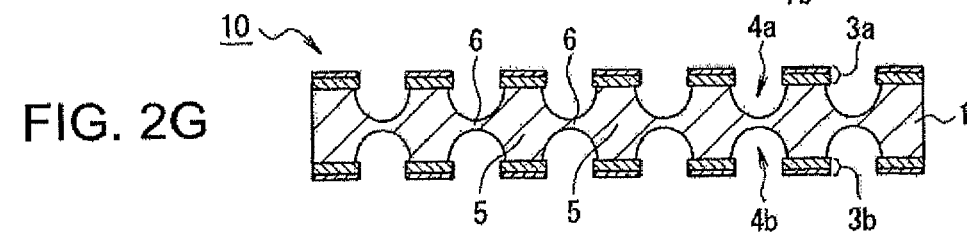

Thereafter, with reference to FIG. 2G, the resist patterns are removed from the substrate 10.

The resist removal process with reference to FIG. 2G is not an essential process in this embodiment. In this embodiment, the resist patterns may be left unremoved on both surfaces of the substrate 10. Also, referring to FIG. 2G, the resist pattern only on the front surface of the substrate 10 may be removed, leaving the resist pattern on the rear surface. Accordingly, the resist pattern may be used as a film for protecting both the plated layer 3*a* and the plated layer 3*b*, or the plated layer 3*b* alone, in the subsequent assembling processes.

In the fabrication method with reference to FIGS. 2A through 2G, the process of FIGS. 2C through 2E may be conducted not by a chemical process but by a physical process. For example, it is also possible to remove part of the plated layers 3*a* and 3*b* by sandblasting or by using a cutting instrument. In a sandblasting process, glass particles, for example, are blasted to abrade part of the plated layers 3*a* and 3*b*. By adjusting the blasting conditions, such as the amount of glass particles and blasting pressure, it is possible to process the plated layers 3*a* and 3*b* as shown in FIG. 2E.

Figure 5:
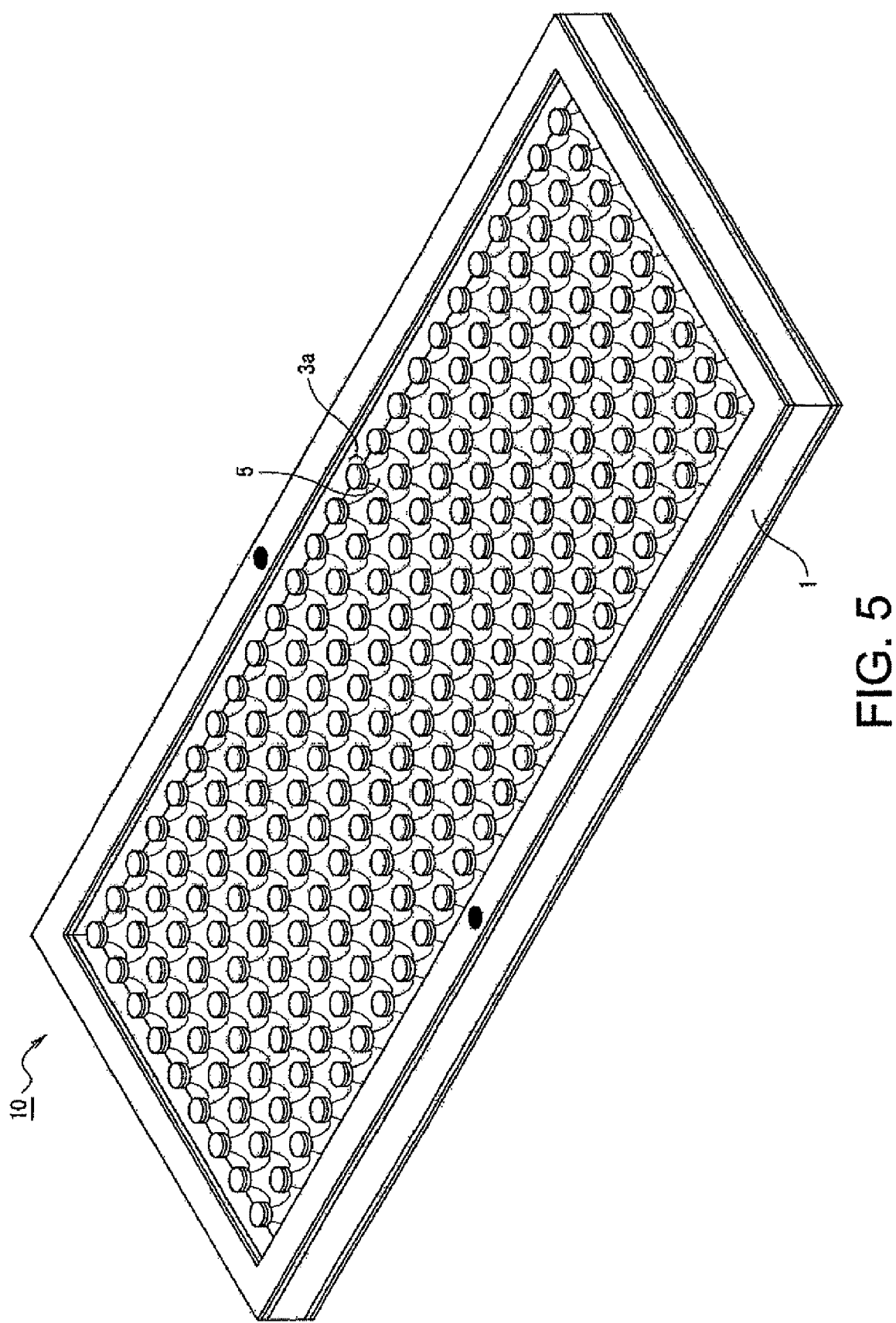
FIG. 5 is a diagram exemplarily showing the configuration of the substrate 10.

FIG. 5 is a diagram exemplarily showing the configuration of the substrate 10. The structure of the substrate 10 provided by the method referring to FIGS. 1A through 1F is identical to the structure of the substrate 10 provided by the method referring to FIGS. 2A through 2G. The sterical configuration of the substrate 10 is illustrated in FIG. 5. Specifically, the substrate 10 includes the plurality of posts 5 which are arranged vertically and horizontally and joined together at the portions between the front surface and the rear surface (e.g., intermediate portions in the thickness direction). The side surface of each post 5 is curved (i.e., bowl-shaped) such that the diameter of the post 5 gradually increases from the front surface, or from the rear surface, to the intermediate portion.

The method for fabricating the semiconductor device by mounting the IC element in a bare state onto the substrate 10 will now be described.

Figure 3A:
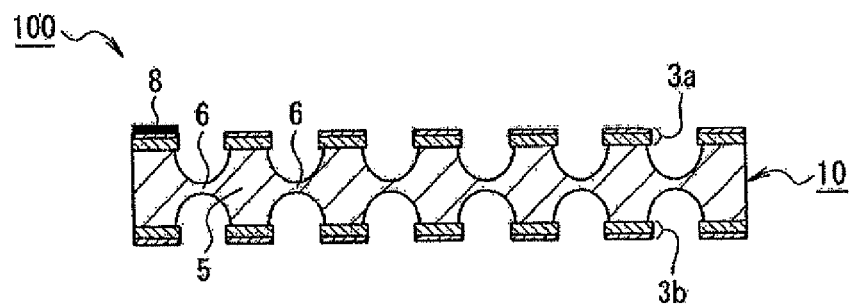
FIGS. 3A through 3E are diagrams showing a method for fabricating a semiconductor device 100 according to the first embodiment.

FIGS. 3A through 3E are sectional diagrams showing the method for fabricating a semiconductor device 100 (from a recognition mark forming step to a resin sealing step) according to the first embodiment of the invention. Referring to FIG. 3A, a recognition mark 8 is first provided on the surface of the substrate 10. In this case, the plurality of posts 5 of the substrate 10 have the same configuration, size, and color. Also, the distance between all adjacent posts 5 (the distance between the centers of all adjacent posts 5) in the vertical direction are identical in plan view, for example, and the distance between all adjacent posts 5 (distance between the centers of all adjacent posts 5) in the horizontal direction are identical in plan view. Therefore, the IC fixation region may not be recognized when mounting (fixing) the IC element onto the substrate 10, and the IC element may not be aligned to the IC fixation region with precision. In this case, the distances between the adjacent posts 5 in the vertical direction may all be equal to the distances between the adjacent posts 5 in the horizontal direction.

Therefore, in this embodiment, the recognition mark 8 is provided by coloring the surface (upper surface) of each post 5 located at a desired position using an inkjet technique or a laser marking technique. To provide the recognition mark 8 by the inkjet technique, a thermo-resistive multicolor ink or a multicolor plate or the like may be employed as the coloring material.

If the multicolor plate is employed, a plating process using a mask may be performed instead of performing the inkjet technique. However, because the plating process using the mask requires various mask original plates in accordance with the recognition marks 8 to be formed in desired positions, the production costs may increase. Therefore, in the process of providing the recognition marks 8, it is desirable to use the inkjet technique or the laser marking technique rather than the plating process using the mask.

Figure 6:
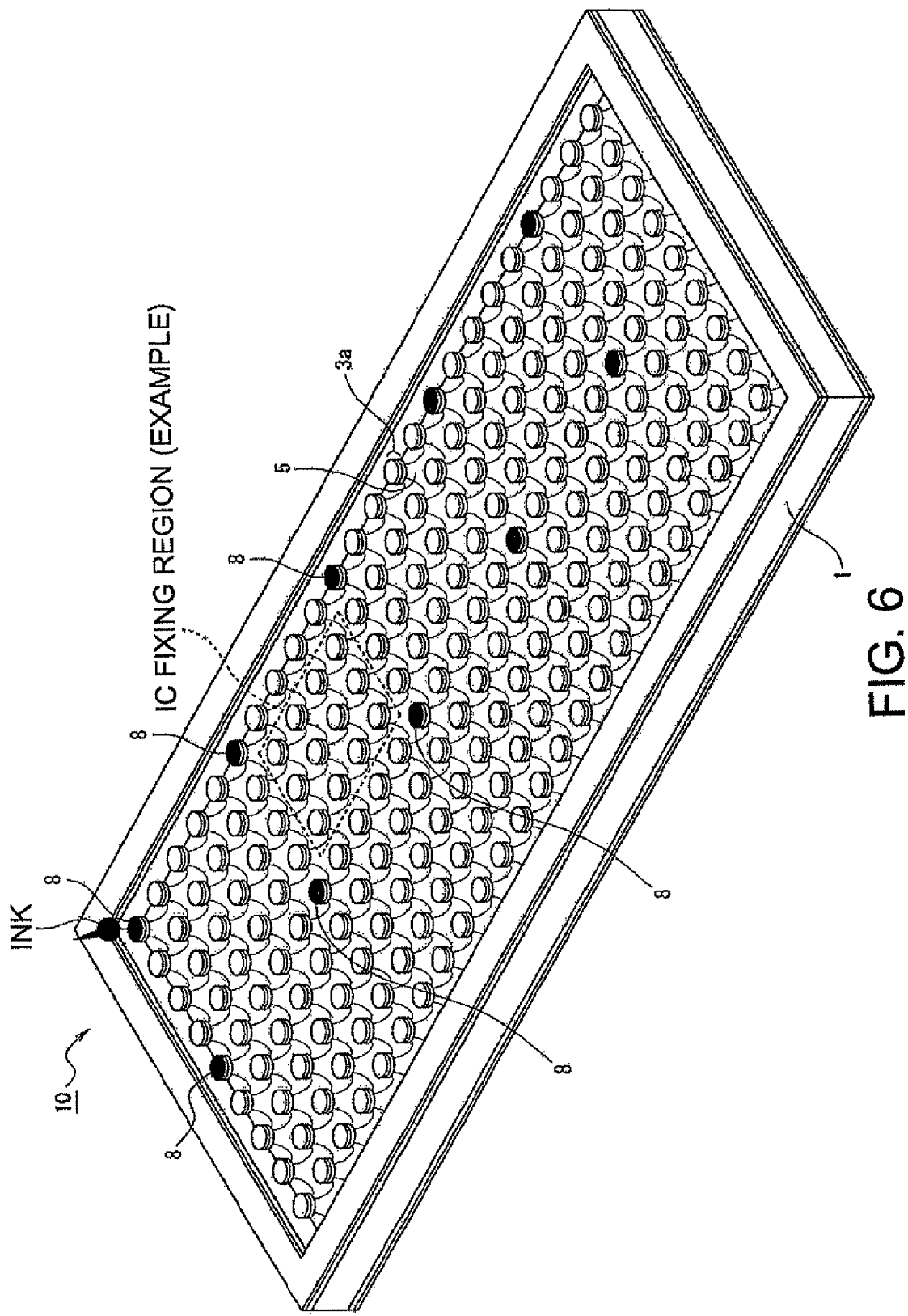
FIG. 6 is a diagram exemplarily showing the positions for forming recognition marks 8 of the substrate 10.

FIG. 6 is a diagram exemplarily showing the alignment positions of the recognition marks 8. The alignment positions of the recognition marks 8 may be located inside or outside the regions for fixing the IC element (i.e., IC fixing regions) or may be located both inside and outside the regions. FIG. 6 shows a case in which the recognition marks 8 are aligned outside an IC fixing region. Each recognition mark 8 keeps a certain distance from the IC fixing region on an extension of a diagonal line of this IC fixing region (e.g., planarly rectangular in shape). The layout interval (pitch) between the recognition marks 8 is fixed, for example. The recognition marks 8 are colored just so that they are recognizable through a camera or the like when mounting the IC element onto the substrate 10. FIG. 6 shows an example of providing black recognition marks 8.

In FIG. 6, two recognition marks 8 correspond to one IC fixing region, for example. However, if the product is such that has some degree of freedom in precision-aligning the IC element on the substrate 10 (i.e., the precision required is not very high), one recognition mark 8 may correspond to one IC fixing region. Often, products that employ wire bonding for connection of the IC element with the posts 5 have some freedom in precision aligning (i.e., not very high precision is required). For such products, it is possible to reduce the number of the recognition marks 8 that correspond to one IC fixing region. For example, a single recognition mark 8 may be provided on a point at the intersection of the diagonal lines of the IC fixing region or on a point at the intersection of the diagonal lines of dicing lines.

Also, products that employ the face-down bonding to couple the IC element to the posts 5 often do not have much freedom in precision aligning (i.e., high alignment precision is required). For such products, it is possible to increase the number of the recognition marks 8 corresponding to one IC fixing region. For example, three recognition marks 8 may correspond to one IC fixing region. Thus, in the embodiment, a desired number of the recognition marks 8 are provided with respect to the kind (model) of the semiconductor device, packaging method, precision required in the alignment, and so forth.

Figure 3B:
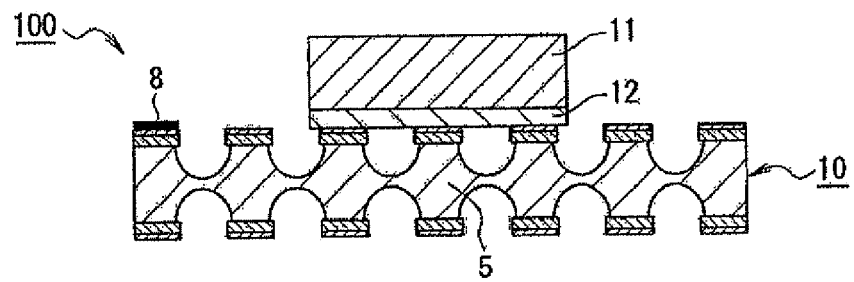

Referring now to FIG. 3B, the IC fixing region is recognized using the recognition mark 8. For example, a region having a certain distance in a certain direction (in the right direction of FIG. 3B in sectional view) from the recognition mark 8 is recognized as the IC fixing region. Then, an IC element 11 is aligned to the recognized IC fixing region, and, while in this aligned state, the IC element 11 is mounted onto the plurality of posts 5 in the IC fixing region. By this technique, the IC element 11 is aligned to the IC fixing region with precision, and the IC element 11 is mounted onto the substrate 10 with minor misalignment. In this die attaching process, an adhesive 12 is used to mount the IC element 11 onto the posts 5. The adhesive 12 used is a thermo-curing agent in a form of paste or sheet, for example.

Figure 3C:
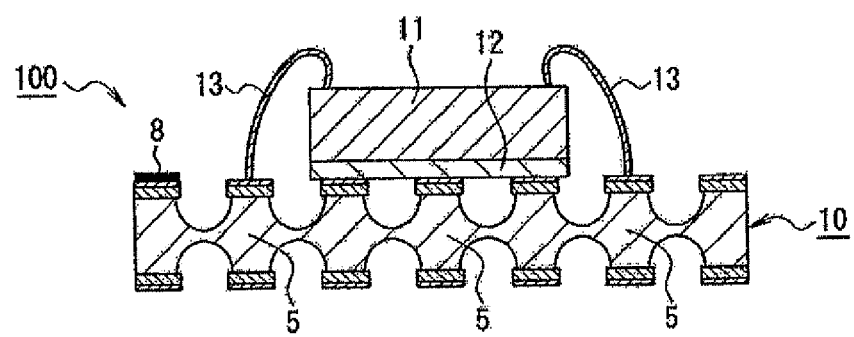

Then, referring to FIG. 3C, the upper surfaces of the posts 5 in the region other than the IC fixing region (i.e., the region not directly under the IC element) are coupled to the pad terminals provided on the active surface of the IC element 11 with gold wires 13, for example. In this case, the posts 5 that become the external terminals are recognized using the recognition mark 8 as a marker, and the recognized posts 5 may be coupled to ends of the gold wires 13. By this technique, it is possible to correctly recognize the posts 5 that become the external terminals, out of the plurality of posts 5, and to connect the gold wires 13 to the recognized posts 5 with precision. If the recognition mark 8 is conductive as are the posts 5 or as is the plated layer 3a, the posts 5 with the recognition mark 8 formed thereon may be coupled to the gold wires 13, and these posts 5 may be used as the external terminals.

Figure 3D:
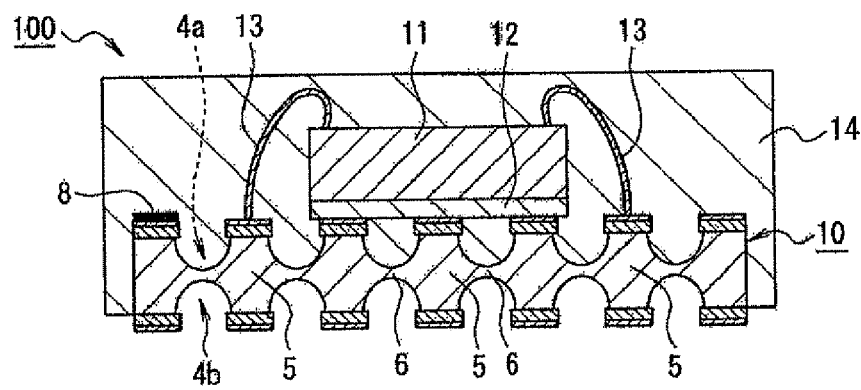

Referring now to FIG. 3D, the entire upper part of the substrate 10 that includes the IC element 11, gold wires 13, and the posts 5 are sealed with a mold resin 14. The mold resin 14 is a thermo-curing epoxy resin, for example. In this resin-sealing process, for example, the side adjacent to the front surface of the substrate 10 including the IC element 11 is covered by the cavity, and pressure inside the cavity is reduced. The mold resin 14 is then supplied into the depressurized cavity. By this supply of resin under reduced pressure, the mold resin 14 is satisfactorily supplied and filled in the cavity, and, with reference to FIG. 3D, the recesses 4a is filled with the mold resin 14 without creating voids.

Thereafter, the joining sections 6 joining the posts 5 together are removed by etching from the side adjacent to the rear surface. The joining sections 6 are etched using the same solution as used when forming the recesses 4a and 4b, such as the ferric chloride solution or the alkaline solution, for example. As a result, with reference to FIG. 3E, the adjacent posts 5 are electrically disconnected from each other, and the posts 5 connected to the gold wires 13 can be used as electrically independent external terminals. Also, because an upper surface side portion of each post 5 is fixed with the mold resin 14, the position of the posts 5 are maintained even after removing the joining sections.

If the photoresist (not shown) remains on the rear surface of the plated layer 3b as a film for protecting the layer 3b, this photoresist is removed after etching the joining sections.

If the plated layer 3b is an Ag plate, the Ag plate may be removed, and another plating process may be conducted. That is, the Ag plate may be removed, and, thereafter, a different kind of plate may be reapplied as the plated layer 3b. An example of such a different kind of plate is Ni/Pd/Au, Ni/Au, or solder. Such reapplication of the plated layer 3b may be conducted after removing the photoresist if the photoresist is formed on the rear surface, or after removing the joining sections if the photoresist is not formed on the rear surface.

Next, the mold resin 14 is diced into separate pieces. In this dicing process, the mold resin 14 is diced into separate resin packages along the dicing lines, while an excess portion of the resin unusable as products is cut off and removed. The dicing of the mold resin 14 is conducted using, for example, the exposed portions on the rear surfaces of the posts 5 as the mark. In this dicing process, referring to FIG. 4A, the terminal sections (i.e., posts 5) may be diced with blades 15 having the same size or larger than the terminals. Alternatively, referring to FIG. 4B, the cutting may be conducted between the terminals (i.e., between one post 5 and its adjacent post 5) using the blades 15 having the same as or narrower than the half etching width. Alternatively, referring to FIG. 4A, the posts 5 having the recognition mark 8 formed thereon may be cut off. The semiconductor device 100 is thereby produced.

If the posts 5 having the recognition mark 8 formed thereon are diced (i.e., if the dicing lines overlap with the recognition mark 8), the recognition mark 8 naturally does not remain within the semiconductor device 100. Also, if the recognition mark 8 is inside the dicing lines, the recognition mark 8 remains within the device 100 even after the dicing, while, if the recognition mark 8 is outside the dicing lines, the recognition mark 8 does not remain within the device 100 after the dicing. Depending on the positional relation between the dicing lines and the recognition mark 8, the recognition mark 8 may or may not remain in the device 100.

As described, according to the first embodiment of the invention, the plurality of posts 5 may be used as the die pads of the IC element 11 or as external terminals of the IC element 11, and, depending on the configuration and size of the IC fixing region that are established as desired, it is possible to use the plurality of posts 5 either as the die pads or the external terminals. Accordingly, it is not necessary to prepare a specific die pad, a specific lead frame, or a specific substrate (e.g., interposer) per each kind of IC element 11 when assembling the semiconductor device 100. It is possible to commonly apply the specification of the substrate used for element mounting and as the external terminals, without restricting the layout (arrangement position) of the pad terminals of each kind of IC element 11. As a result, the costs of producing the semiconductor device may be reduced.

Additionally, the metal is not gathered in one place unlike the die pads of the related art. Because the posts 5 that function as the die pads or the external terminals are distributed within the resin package, it is possible to spread the positions of moisture aggregation and to reduce concentration of water vapor pressure. As a result, it is possible to suppress cracking of the resin package during a reliability test associated with moisture absorption and heating (a test to examine whether or not malfunction occurs to the resin package made from the mold resin 14 when the resin package is heated while left under a high moisture atmosphere) and to thereby enhance the reliability of the semiconductor device 100.

Moreover, only a desired number of recognition marks 8 are provided with respect to the kind (model) of the semiconductor device, packaging method, precision required in the alignment, and so forth. By the die attaching process, the IC fixing region is recognized using the recognition marks 8 as a marker. Through such a process, the IC fixing region is correctly recognized. As a result, the IC element 11 is aligned to the IC fixing region with precision, and the IC element 11 is mounted onto the posts 5 in the IC fixing region with minor misalignment.

Figure 7:
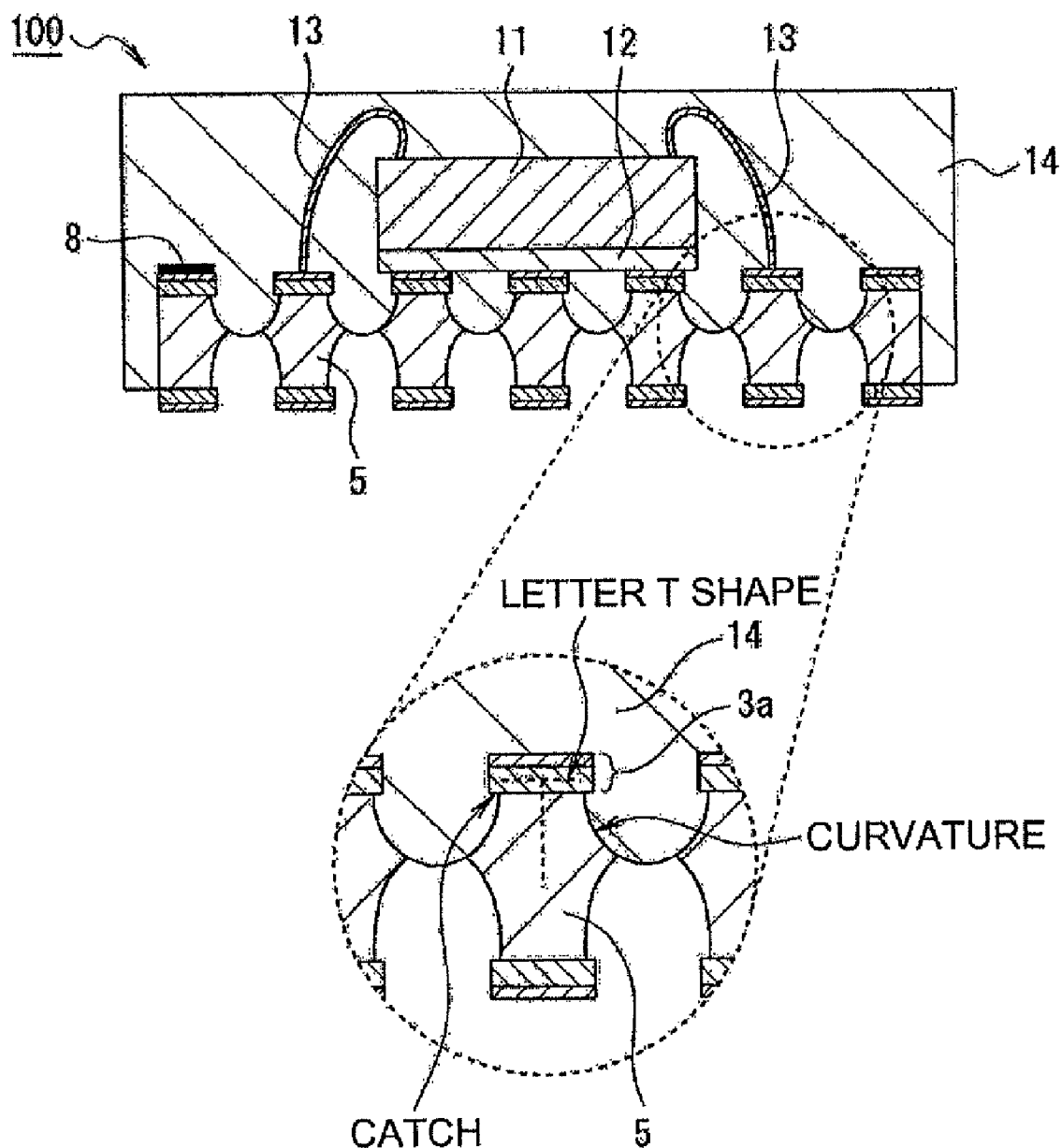
FIG. 7 is a diagram exemplarily showing the sectional configuration of the semiconductor device 100.

Also, with reference to FIG. 7, the side surface of each post 5 is sectionally curved, and the recesses 4a and 4b between the adjacent posts 5 are sectionally bowl-shaped. Accordingly, it is possible to increase the area of contact between the mold resin 14 and the side surface of the post 5, as compared to when the side surface of the post 5 is not curved (that is, the side surface of the post 5 is perpendicular to the front and rear surfaces of the same) and to increase the bond between the first resin and the post 5.

Furthermore, the plated layer 3a formed on the surface of each post 5 protrudes from the surface to outside, and the sectional configurations of the plated layer 3a and the post 5 together form the letter "T" shape as expressed in dotted lines in FIG. 7. This protrusion of the plated layer 3a catches the mold resin 14, and the plated layer 3a thereby produces the anchor effect.

As described, in the first embodiment of the invention, the posts 5 are pressed toward the mold resin 14 and prevented from falling from the mold resin 14 because of the following two countermeasures against falling: (a) curved configuration of the side surface of each post 5, and (b) anchor effect by the plated layer 3a and the post 5 forming the letter T.

In the first embodiment, the copper plate 1 corresponds to the "metal plate" of the embodiments of the invention, and the front surface of the copper plate 1 corresponds to the "first surface" of the embodiments of the invention, and the rear surface of the copper plate 1 corresponds to the "second surface" of the embodiments of the invention. Also, the post 5 corresponds to the "metal post" of the embodiments of the invention, and the post 5 having the IC element 11 mounted thereon corresponds to the "first metal post" of the embodiments of the invention, and the post 5 coupled to the gold wire 13 via the plated layer 3a corresponds to the "second metal post" of the embodiments of the invention. Further, the gold wire 13 corresponds to the "first conductive member" of the embodiments of the invention, and the mold resin 14 corresponds to the "first resin" of the embodiments of the invention. Furthermore, the plated layer 3a corresponds to the "first plated layer" of the embodiments of the invention, and the plated layer 3b corresponds to the "second plated layer" of the embodiments of the invention.

2. Second Embodiment

Figure 3E:
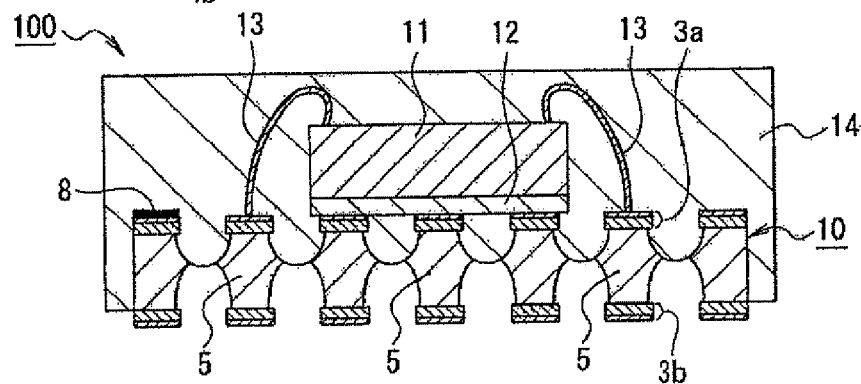
Figure 8A:
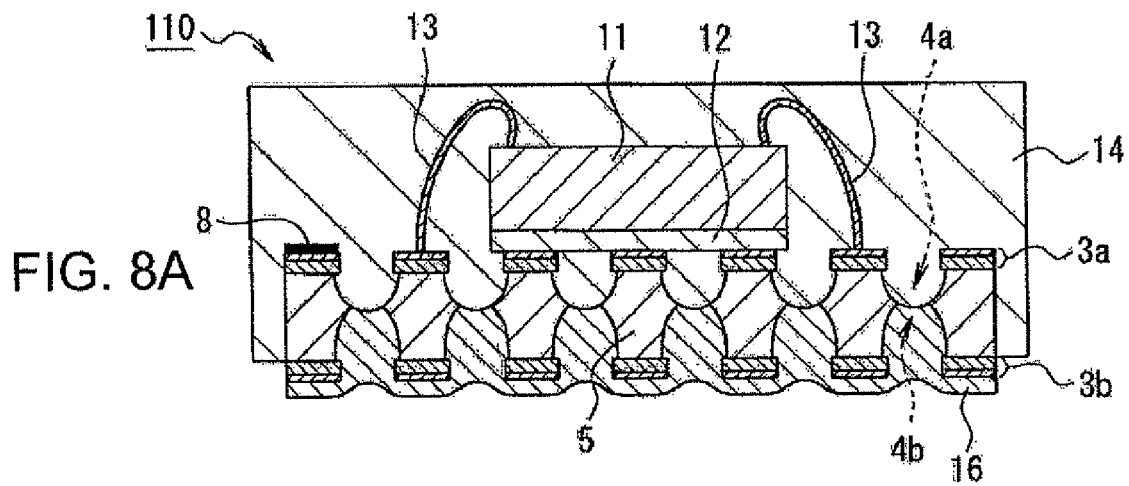
FIGS. 8A through 8C are diagrams showing a method for fabricating a semiconductor device 110 according to a second embodiment.
Figure 8B:
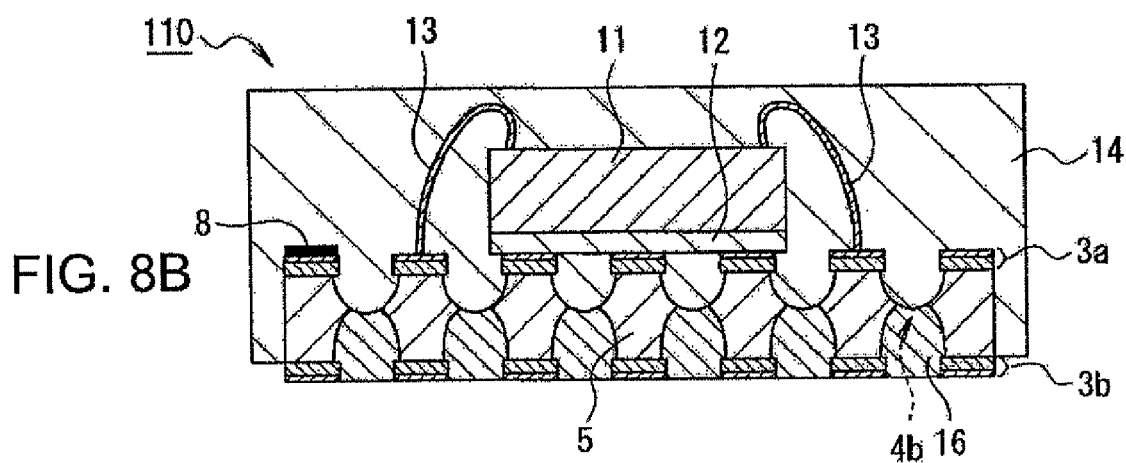
Figure 8C:
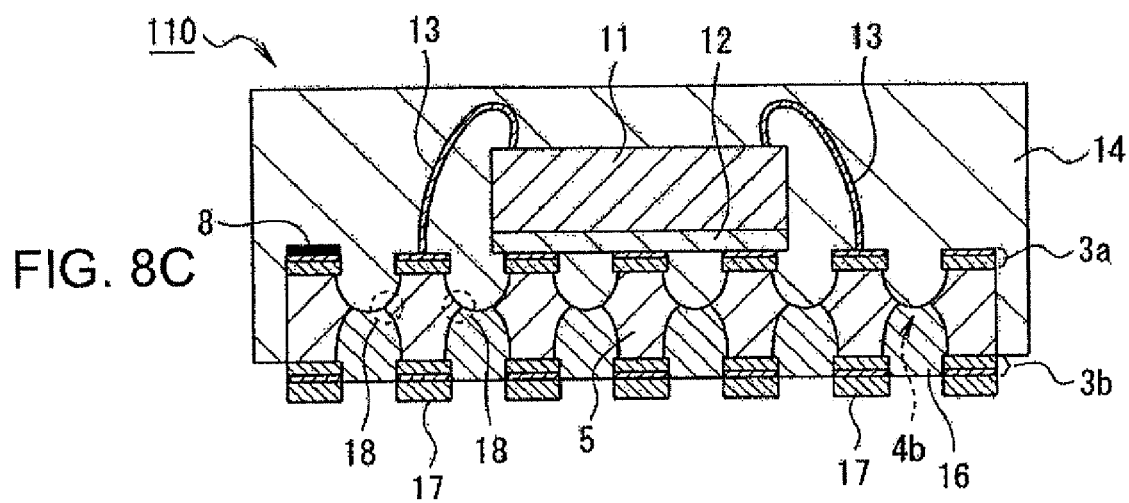

FIGS. 8A through 8C are sectional diagrams showing the method for fabricating a semiconductor device 110 according to the second embodiment of the invention. Explained in this embodiment are cases in which the recesses 4b on the side adjacent to the rear surface of the substrate 10 are filled with a resist after penetrating the rear surface (i.e., removing the joining sections 6) as shown in FIG. 3E, and in which Ni/Pb/Au or Ni/Au is used as the solder plate 3b on the side adjacent to the rear surface or in which a solder plate is additionally provided on the plated layer 3b on the side adjacent to the rear surface. The constituting elements of FIGS. 8A through 8C that are identical to those of the first embodiment are allotted the same reference numbers, and explanations thereof will not be repeated.

Referring to FIG. 8A, the processes up to the rear surface penetration step are the same as those in the first embodiment. In this second embodiment, after the rear surface penetration step, a solder resist 16 is coated on the side adjacent to the rear surface of the substrate 10 so as to fill the recesses 4b. Then, the solder resist 16 is subjected to exposure and development so as to partially remove the solder resist 16. Referring to FIG. 8B, the plated layer 3b is exposed, while leaving the solder resist 16 in the recesses 4b.

If the solder resist 16 is a positive type, the solder resist 16 is exposed using a photomask (not shown) that shields only regions of the solder resist 16 with the recesses 4b formed thereon. If the solder resist 16 is a negative type, the solder resist 16 is exposed using a photomask (not shown) that shields only regions of the solder resist 16 with the posts 5 formed thereon. As a result, the solder resist 16 remains in the recesses 4b.

Then, referring to FIG. 8C, a terminal section 17 such as the solder plate is provided on the surface of the exposed plated layer 3b. The mold resin 14 is then diced into separate pieces. In this dicing process, as shown with reference to FIG. 4A, the posts 5 may be diced with the blades 15 having the same size as or larger than the terminals. Alternatively, as shown with reference to FIG. 4B, the cutting may be conducted between the posts 5 using the blades 15 having the same width as or narrower than the half etching width. Depending on the positional relation between the dicing lines and the recognition mark 8, the recognition mark 8 may or may not remain within the semiconductor device 110. The semiconductor device 110 is thereby produced.

As described, according to the second embodiment, because the solder resist 16 is filled in the recesses 4b, the connection between the adjacent posts 5 is stronger compared to that in the first embodiment. In addition, each post 5 has a saucer-like protrusion 18 at a middle portion of the thickness direction of the port 5. This protrusion 18 is fixed on the side adjacent to the mold resin 14 using the solder resist 16. The protrusion 18 is a boundary for wet etching that proceeds from both front and rear surfaces. It can be said that the protrusion 18 is, for example, a section having a width sectionally wider than those of the other portions of the post 5.

According to the second embodiment of the invention, it is possible to press the posts toward the mold resin 14 and to prevent the posts 5 from falling from the mold resin 14 because of the following three countermeasures against falling: (a) curved configuration of the side surface of each post 5, (b) anchor effect by the plated layer 3a and the post 5 forming the letter T, and (c) suppression of falling by use of the solder resist 16 (including fixation of the protrusion 18).

In the second embodiment, the solder resist 16 corresponds to the "second resin" of the embodiments of the invention. The other corresponding relations are the same as those in the first to third embodiments.

3. Third Embodiment

Figure 9A:
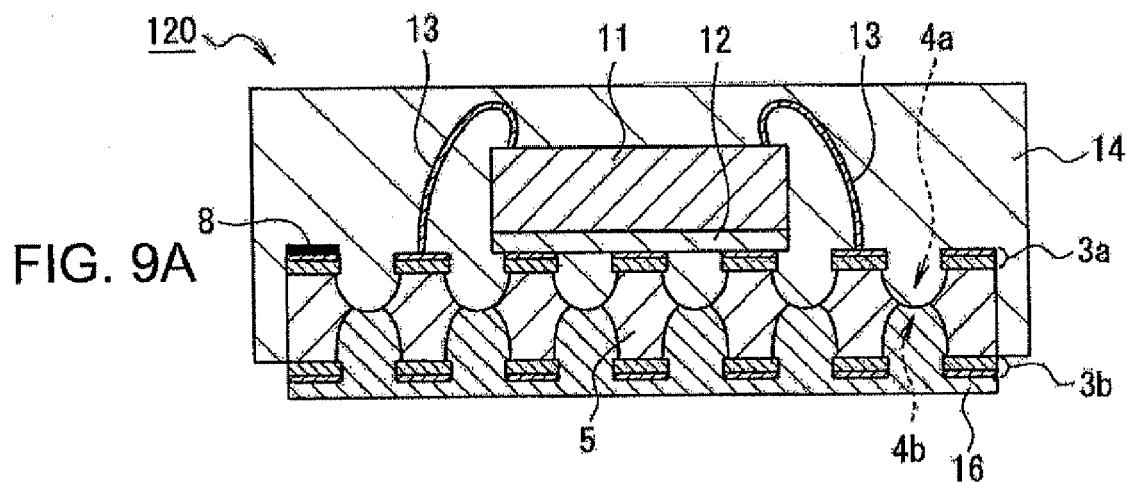
FIGS. 9A through 9C are diagrams showing a method for fabricating a semiconductor device 120 according to a third embodiment.
Figure 9B:
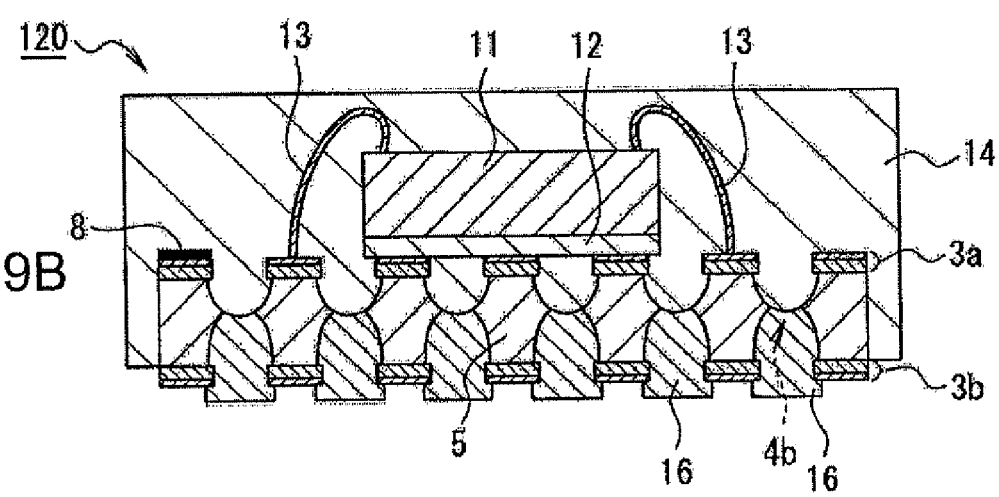
Figure 9C:
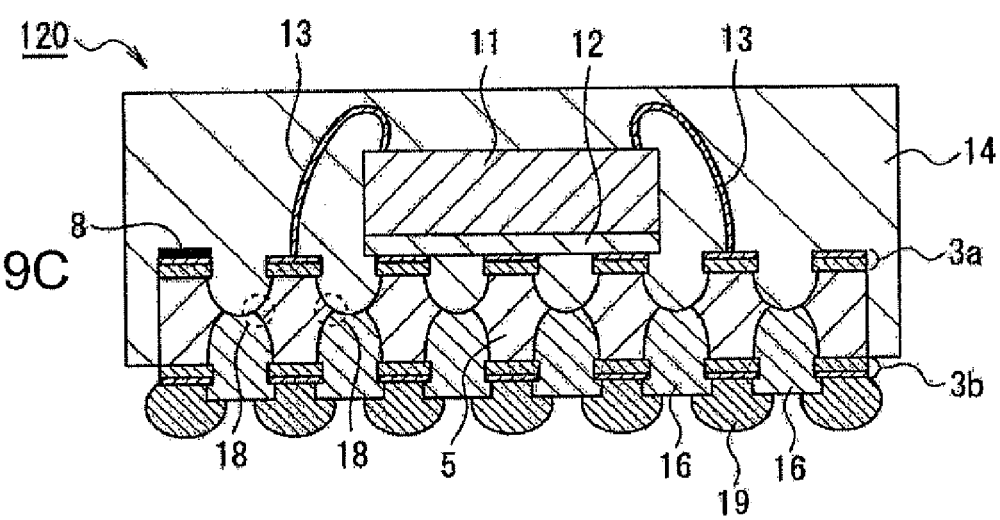

FIGS. 9A through 9C are sectional diagrams showing the method for fabricating a semiconductor device 120 according to the third embodiment of the invention. Explained herein is a case in which the recesses 4b on the side adjacent to the rear surface of the substrate are filled with the solder resist 16 after penetrating the rear surface (i.e., removing the joining sections 6) shown in FIG. 3E and, also, in which solder balls 19 are mounted on the plated layer 3b. The constituting elements of FIGS. 9A through 9C that are identical to those of the first and second embodiments are allotted the same reference numbers, and explanations thereof will not be repeated.

Referring to FIG. 9A, the processes up to the rear surface penetration step are the same as those in the first embodiment. In the third embodiment, after the rear surface penetration step, the solder resist 16 is coated on the rear surface of the substrate 10 so as to fill the recesses 4b. In this embodiment, the solder resist 16 is coated more thickly than in the second embodiment. Then, the solder resist 16 is subjected to exposure and development so that the solder resist 16 is partially removed. Referring to FIG. 9B, the plated layer 3b is exposed, while the solder resist 16 remains in the recesses 4b. In this embodiment, with reference to FIG. 9B, apertures (to expose the plated layer 3b) of the solder resist 16 are made smaller than in the first embodiment so that the solder resist 16 overhangs the side adjacent to each post 5.

Then, referring to FIG. 9C, the solder balls 19 are mounted on the plated layer 3b that is exposed from the solder resist 16. In this case, because the exposed surface of the plated layer 3b becomes small (i.e., is narrowed down) by the solder resist 16, it is possible to mound up the solder balls 19 to sectionally take the shapes of mushrooms. With these solder balls 19, stable terminal-mounting area and height (coplanarity) are acquired, which is a property advantageous to the secondary packaging.

Thereafter, the mold resin 14 is diced into separate pieces. This dicing process is the same as that shown with reference to FIG. 4A or FIG. 4B. That is, as shown in FIG. 4A, the posts 5 may be diced with the blades 15 having the same size as or larger than the terminals, or, as shown to FIG. 4B, the cutting may be conducted between the posts 5 using the blades 15 having the same width as or narrower than the half etching width. Alternatively, referring to FIG. 4A, the posts 5 having the recognition mark 8 formed thereon may be cut off. Depending on the positional relation between the dicing lines and the recognition mark 8, the recognition mark 8 may or may not remain within the semiconductor device 110. The semiconductor device 110 is thereby produced.

Figure 10:
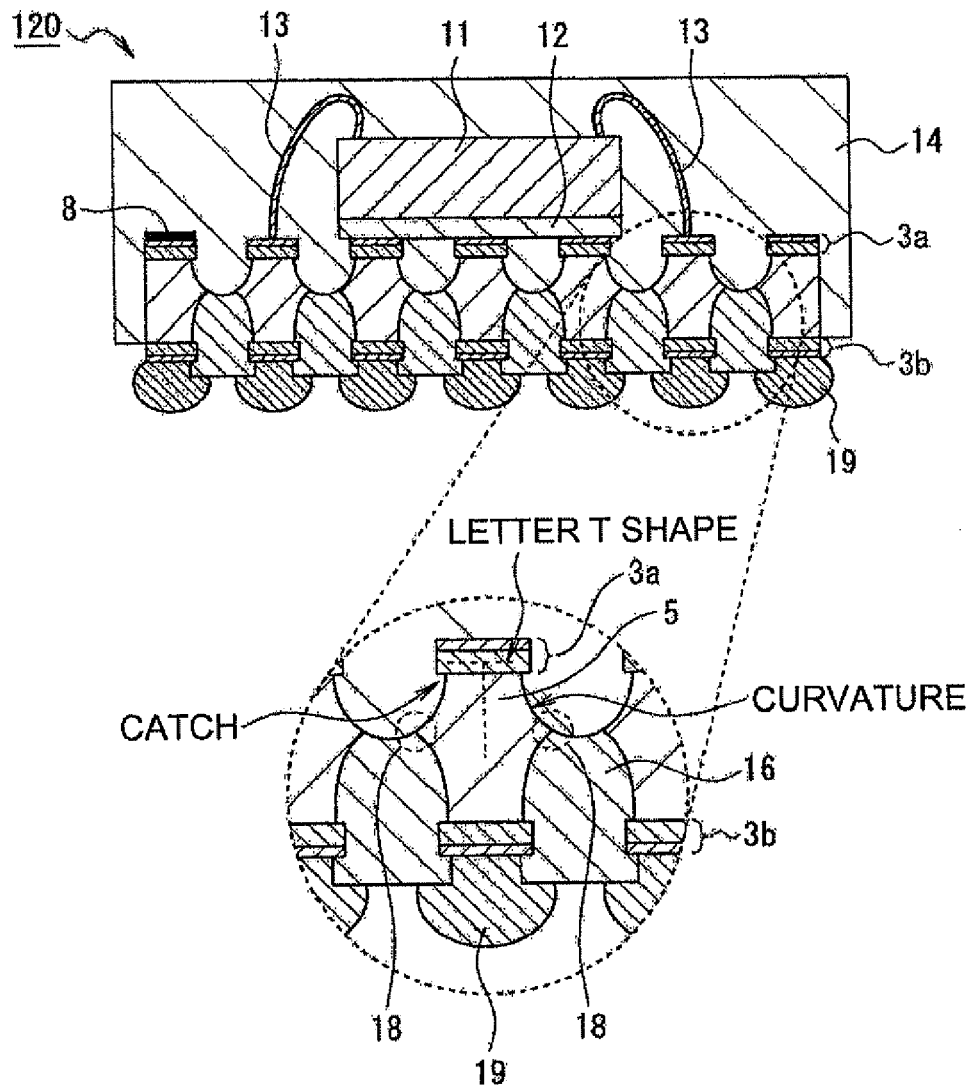
FIG. 10 is a diagram exemplarily showing the sectional configuration of the semiconductor device 120.

As described, according to the third embodiment, because the solder resist 16 is filled in the recesses 4b as is in the second embodiment, the connection between the adjacent posts 5 is stronger compared to the first embodiment. In addition, referring to FIG. 10, at the middle portion in the thickness direction of each post 5, there is the saucer-like protrusion 18 which is formed by wet etching from both front and rear surfaces. The protrusion 18 is fixed with the solder resist 16 on the side adjacent to the mold resin 14.

Moreover, the solder resist 16 filled in the recesses 4b overhangs the side adjacent to each of the post 5, and the overhung portions hold peripheries of the plated layer 3b. Also, these portions of the solder resist 16 overhanging the posts 5 are held by the solder balls 19. Having such a structure, it is possible to hold the posts 5 having the plated layer 3b formed thereon with the solder resist 16 and to hold the solder resist 16 with the solder balls 19.

According to the third embodiment of the invention, it is possible to press the posts 5 toward the mold resin 14 and prevent the posts 5 from falling from the mold resin 14 because of the following four countermeasures against falling: (a) curved configuration of the side surface of each post 5, (b) anchor effect by the plated layer 3a and the post 5 forming the letter T, (c) holding by use of the solder resist 16 (including both fixing the protrusion 18 and holding by the overhang structure from under), and (d) pressing using the mushroom-shaped solder balls.

In the third embodiment, the solder ball 19 corresponds to the "second conductive member" of the embodiments of the invention. The other corresponding relations are the same as those in the first and second embodiments.

4. Fourth Embodiment

Figure 11:
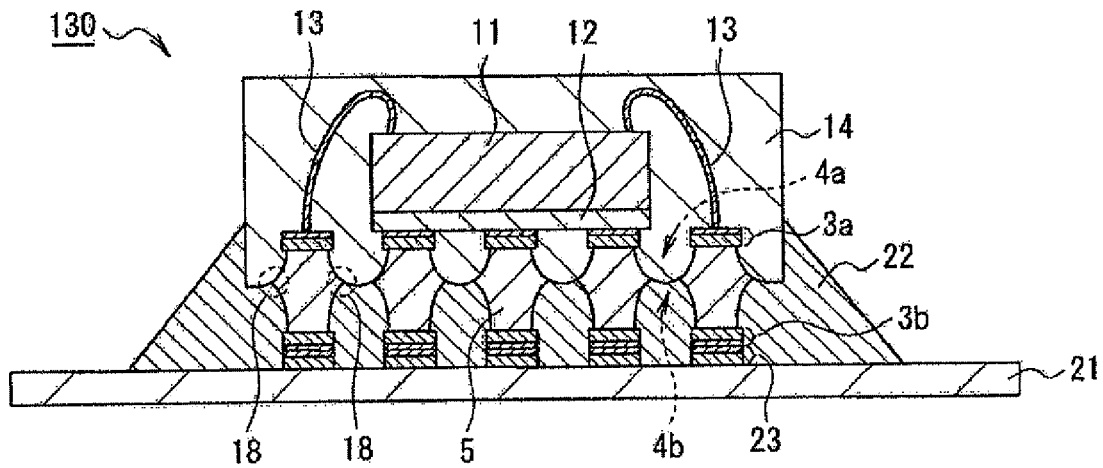
FIG. 11 is a diagram exemplarily showing the composition of a semiconductor device 130 according to a fourth embodiment.

FIG. 11 is a sectional diagram exemplarily showing the composition of a semiconductor device 130 according to the fourth embodiment. The constituting elements of FIG. 11 that are identical to those of the drawings explained in the first to third embodiments are allotted the same reference numbers, and explanations thereof will not be repeated.

The semiconductor device 130 with reference to FIG. 11 is a device produced by mounting, onto a motherboard 21, the semiconductor device 100 (see FIG. 7) that has been diced in the first embodiment and by filling an underfill 22 between the mold resin 14 and the motherboard 21. Specifically, with the semiconductor device 130, the plated layer 3b provided on the rear surface of each post 5 is joined to a wiring layer 23 provided on the surface of the motherboard 21. Also, the exposed portion of the post 5 exposed from the mold resin 14, the plated layer 3b, and the wiring layer 23 are sealed with the underfill 22 between the mold resin 14 and the motherboard 21. Thus, by filling the underfill 22 after the secondary packaging, it is possible to improve reliability in coupling the IC element 11 to the motherboard 21.

In the fourth embodiment, the underfill 22 corresponds to the "third resin" of the embodiments of the invention. The other corresponding relations are the same as those in the first embodiment.

5. Fifth Embodiment

Explained in the previous first embodiment is a case in which the joining sections 6 are etched and removed after mounting the IC element 11 onto the substrate 10. However, in the embodiments of the present invention, the joining sections 6 may be etched before mounting the IC element 11. In the fifth embodiment, such a method will be described.

FIGS. 12A through 12C and 13A through 13D are sectional diagrams showing the method for fabricating a semiconductor device 140 according to the fifth embodiment of the invention. The constituting elements of FIGS. 12A through 13D that are identical to those of the drawings explained in the first to fourth embodiments are allotted the same reference numbers, and explanations thereof will not be repeated.

Figure 12A:
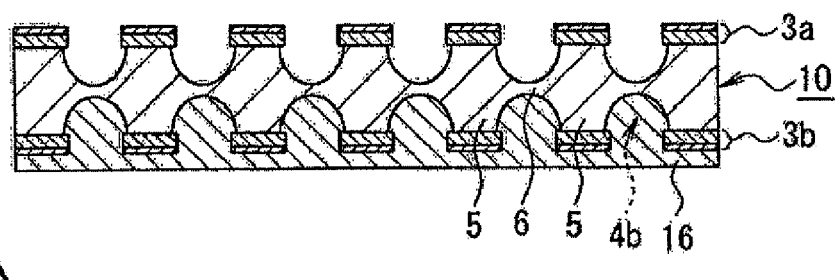
FIGS. 12A through 12C are diagrams showing a method for fabricating a semiconductor device 140 according to a fifth embodiment.
Figure 12B:
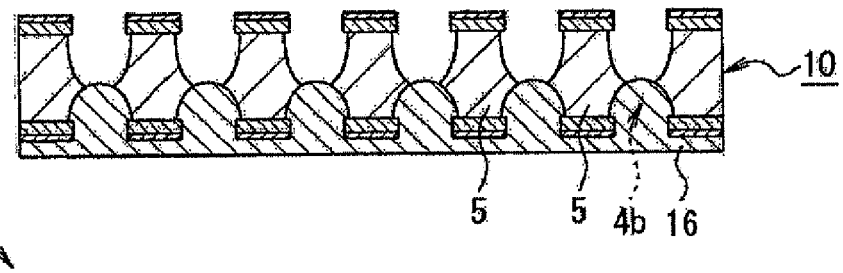

Referring to FIG. 12A, the substrate 10 is fabricated by the method described with reference to FIGS. 1A through 1F or FIGS. 2A through 2G. The solder resist 16 is coated on the rear surface of the substrate 10 so as to fill the recesses 4b. In this case, as in the third embodiment, for example, the solder resist 16 is coated thickly.

Then, the joining sections 6 joining the posts 5 together are removed by etching from the side adjacent to the front surface. In etching the joining sections 6, the ferric chloride solution or the alkaline solution is used, for example. As a result, with reference to FIG. 12B, the adjacent posts 5 are electrically disconnected from each other. Also, in this fifth embodiment, the solder resist 16 is filled in the recesses 4b when etching the joining sections. Thus, even after the joining sections are removed, the joined state of the adjacent posts 5 is maintained because of the solder resist 16.

Figure 12C:
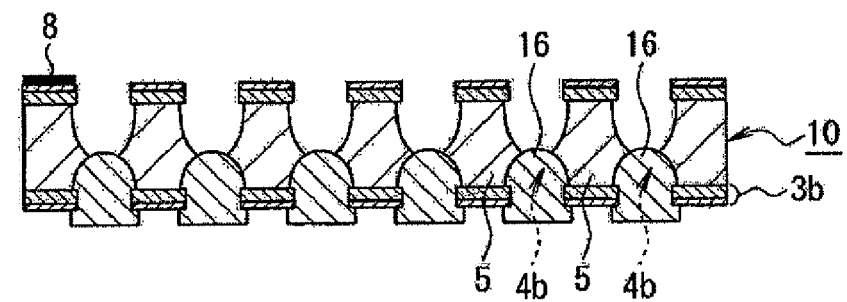

Then, with reference to FIG. 12C, the solder resist 16 is subjected to exposure and development so as to partially remove the solder resist 16 and expose the plated layer 3b while keeping the solder resist 16 remained in the recesses 4b. In this embodiment, as is in e.g. the third embodiment, the solder resist 16 is made to overhang the side adjacent to each post 5.

Then, the recognition mark 8 is provided by coloring the surface (upper surface) of the post 5 in a desired position of the substrate 10 by use of the inkjet technique or the laser marking technique. To provide the recognition mark 8 by the inkjet technique, the thermo-resistive multicolor ink or the multicolor plate or the like may be applied as the coloring material. The process of providing the recognition mark 8 may be conducted prior to the process of partially removing the solder resist 16. However, it is desirable to provide the recognition mark 8 after the process of removing the solder resist 16 or just before a die attaching process which will be described hereafter, in order to avoid the risks of damaging or eliminating the mark 8 in the process of removing the solder resist 16 and in processes conducted after having provided the mark 8.

Figure 13A:
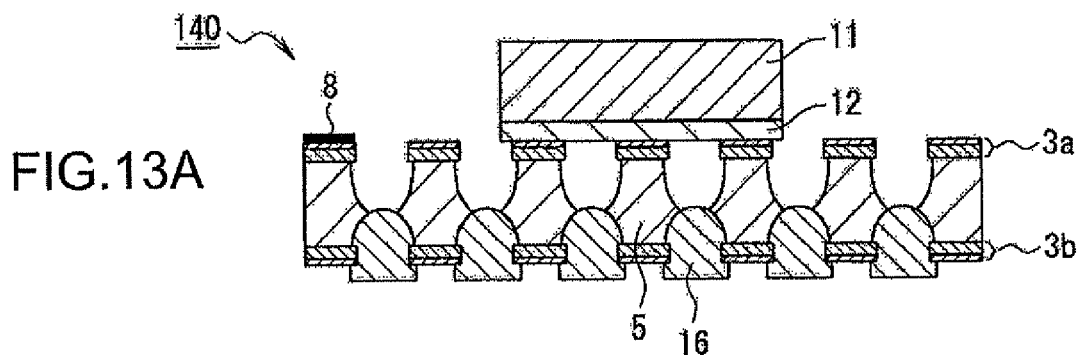
FIGS. 13A through 13D are diagrams showing the method for fabricating the semiconductor device 140 according to the fifth embodiment.

Thereafter, with reference to FIG. 13A, each IC element 11 is mounted onto the plurality of posts 5 in the IC fixing region with the adhesive 12. In this die attaching process, the IC fixing region is recognized using the recognition mark 8 as a marker, and the IC element 11 is aligned to the recognized IC fixing region. While keeping the IC element aligned to the IC fixing region, the IC element 11 is mounted onto the plurality of posts 5 in the IC fixing region. By this process, the IC element 11 is aligned to the IC fixing region with precision, and the IC element 11 is mounted onto the substrate 10 with minor misalignment.

Figure 13B:
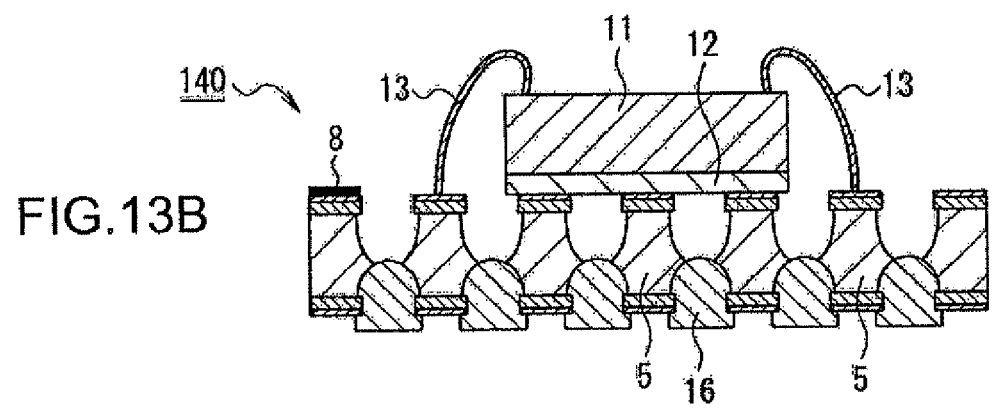
Figure 13C:
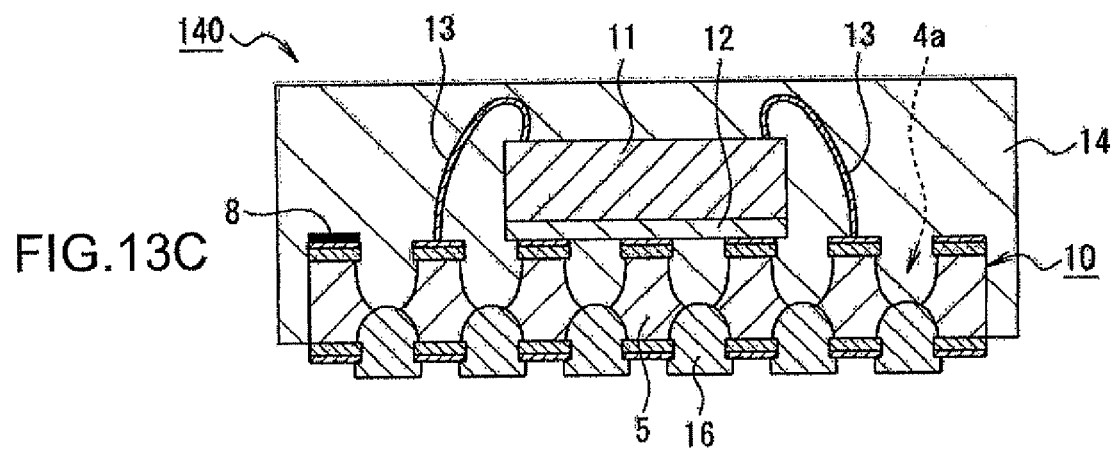

Then, referring to FIG. 13B, the surfaces of the posts 5 in the region outside the IC fixing region (i.e., the region not directly under the IC element) are coupled with e.g. the gold wires 13 to the pad terminals provided on the active surface of the IC element 11. In this case, using the recognition mark 8 as a marker, the posts 5 that become the external terminals are recognized, and the recognized posts 5 may be coupled to ends of the gold wires 13. By this method, it is possible to correctly recognize the posts 5 that become the external terminals, out of the plurality of posts 5, and to connect the gold wires 13 to the recognized posts 5 with precision.

Thereafter, referring to FIG. 3C, the entire upper part of the substrate 10 which includes the IC element 11, gold wires 13, and posts 5 are sealed with the mold resin 14. The mold resin 14 is a thermo-curing epoxy resin, for example. As in the first embodiment, in this resin-sealing process, also, the front surface side of the substrate 10 including the IC element 11 is covered by the cavity, for example. Then, the pressure inside the cavity is reduced, and the mold resin 14 is supplied into the depressurized cavity. By this supply of resin under reduced pressure, the mold resin 14 is satisfactorily supplied and filled in the recesses 4a without the voids, with reference to FIG. 13C.

Figure 13D:
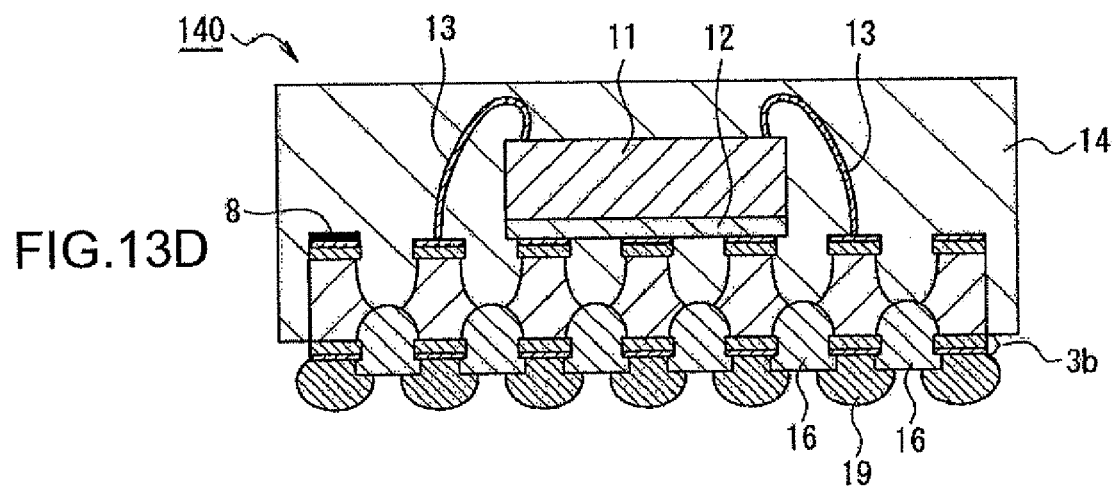

Then, referring to FIG. 13D, the solder balls 19 are mounted on the plated layer 3b which is exposed from the solder resist 16. In this case, as in the third embodiment, because the exposed surface of the plated layer 3b becomes small (i.e., narrowed down) by the solder resist 16, the solder balls 19 can be formed into mushroom shapes in sectional view. Thereafter, the mold resin 14 is diced into separate pieces. This dicing process is the same as shown with reference to FIG. 4A or 4B, and the post 5 with the recognition mark 8 formed thereon may be cut off. Depending on the positional relation between the dicing lines and the recognition mark 8, the recognition mark 8 may or may not remain within the semiconductor device 140. The semiconductor device 140 is thereby produced.

As described, according to the fifth embodiment of the invention, the IC fixing region is recognized using the recognition mark 8 as a marker, and the IC element 11 is aligned to the recognized IC fixing region, as is in the first embodiment. It is therefore possible to align the IC element 11 to the IC fixing region with precision and to mount the IC element 11 onto the posts 5 in the IC fixing region with minor misalignment. Also, according to the fifth embodiment of the invention, it is possible to press the posts 5 toward the mold resin 14 and prevent the posts 5 from falling from the mold resin 14 because of the following four countermeasures against falling: (a) curved configuration of the side surface of each post 5, (b) anchor effect by the plated layer 3a and the post 5 forming the letter T, (c) suppression of falling by use of the solder resist 16 (including fixation of the protrusion 18 and the overhung structure), and d) suppression of falling using the mushroom-shaped solder balls.

Moreover, according to the fifth embodiment of the invention, the joined state of the adjacent posts 5 is maintained because of the solder resist 16 even after removing the joining sections 6 made from the copper plate. Therefore, it is possible, for example, to distribute the substrate 10 in the state as shown in FIG. 12C and to assemble the semiconductor device 140 even in an assembling process (or facility) that does not use (have) apparatuses for etching the copper plate, coating the solder resist, and performing the exposure and development.

In the fifth embodiment, the joining section 6 and the solder resist 16 correspond to the "joining section" of the embodiments of the invention. The other corresponding relations are the same as those in the third embodiment.

6. Sixth Embodiment

Explained in the first embodiment with reference to FIGS. 1A to 1F and 2A to 2G is the method for fabricating the substrate 10 by half etching the copper plate 1 from the front and rear surfaces. However, the substrate fabrication method according to the invention is not limited to such a method. For example, the substrate may be fabricated by half etching only the front surface of the copper plate 1. This process will be described in the sixth embodiment. In the sixth embodiment, two fabrication methods will be described with reference to FIGS. 14A through 14F and FIGS. 15A through 15G to exemplify the substrate fabrication method. FIGS. 14A through 14F show the fabrication method applying the semi additive technique, and FIGS. 15A through 15G show the fabrication method applying the subtractive technique. After the two fabrication methods are described, processes of mounting the IC element and resin sealing will be described with reference to FIGS. 16A through 16D.

FIGS. 14A through 14F are sectional diagrams showing the method (semi additive technique) for fabricating a substrate 20 according to the sixth embodiment if the invention. The constituting elements of FIGS. 14A to 14F that are identical to those of the drawings of the first to fifth embodiments are allotted the same reference numbers, and explanations thereof will not be repeated.

Figure 14A:
FIGS. 14A through 14F are diagrams showing a method for fabricating a substrate 20 according to a sixth embodiment.
Figure 14B:
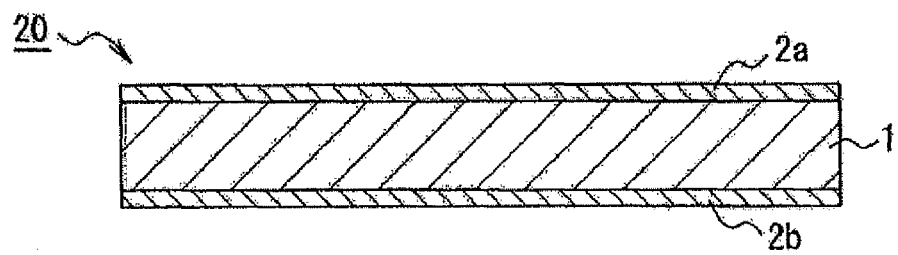
Figure 14C:
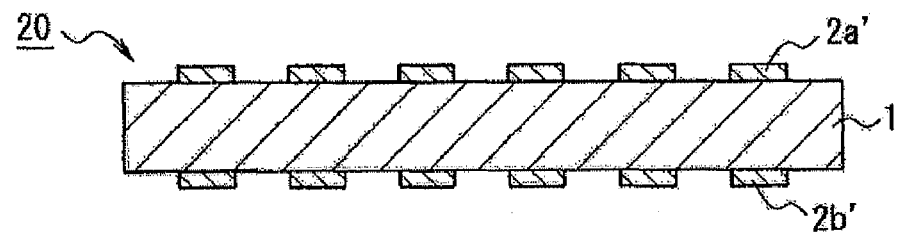

At first, referring to FIG. 14A, the copper plate 1 is prepared. Thereafter, referring to FIG. 14B, the photoresists 2a and 2b are coated on the respective front and rear surfaces of the copper plate 1. Then, referring to FIG. 14C, the photoresists 2a and 2b are subjected to exposure and development so as to expose the regions for forming the posts 5 and to form the resist patterns 2a' and 2b' over the other regions. In this case, the resist pattern 2a' is formed on the front surface of the copper plate 1, while the resist pattern 2b' is formed on the rear surface of the copper plate 1.

Figure 14D:
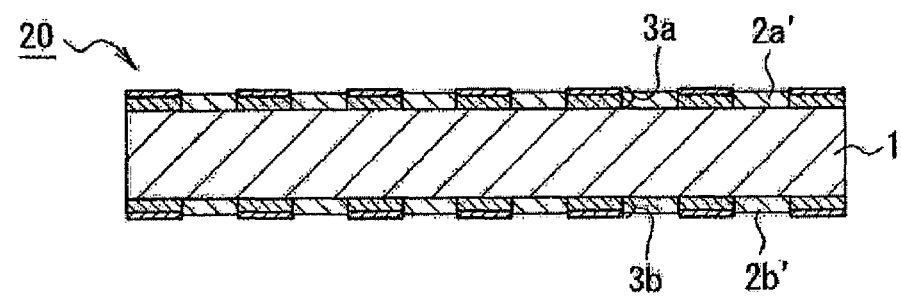

Then, referring to FIG. 14D, the plated layers 3a and 3b are provided by e.g. electrolytic plating in the regions on the copper plate 1 that are exposed from the resist patterns 2a' and 2b' (i.e., the regions for forming the posts 5). After the plated layers 3a and 3b are provided, the resist patterns are removed the both front and rear surfaces of the copper plate 1, with reference to FIG. 14E. Then, referring to FIG. 14F, the copper plate 1 is half-etched from the front surface side using the plated layer 3a as a mask so as to form the recesses 4a. In this step of FIG. 14F, the copper plate 1 is etched only from the side adjacent to the front surface, leaving the side adjacent to the rear surface unetched. Such one-surface etching is possible by the spray type wet etching. The etchant used is the ferric chloride solution or the alkaline solution, for example, and the etchant is sprayed toward the front surface of the copper plate 1 to thereby form the recesses 4a.

The depth of the recesses 4a may be half, or more or less than half, the thickness of the thickness of the copper plate 1. For the same reason as mentioned in the first embodiment, the substrate 20 may be rinsed after the half etching. Alternatively, after the rinsing treatment, the front and rear surfaces of the copper plate 1 (including the inner surfaces of the recesses) may be coated with an antioxidant.

Figure 14E:
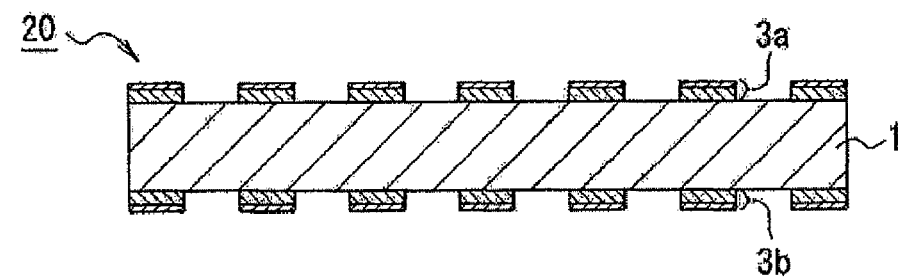
Figure 14F:
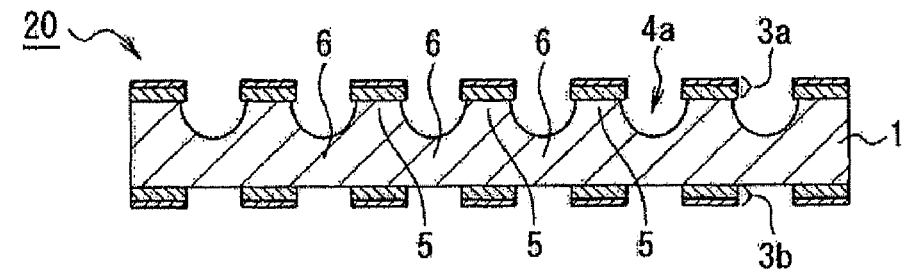

Also, referring to FIG. 14E, a plate-protecting photoresist (not shown) may be additionally provided on the front and rear surfaces of the copper plate 1 before etching the copper plate 1. In the process of etching the copper plate 1, the copper plate 1 is etched from the side adjacent to the front surface using the plated layer 3 covered by this photoresist as a mask. Accordingly, the plated layers 3a and 3b are protected from the etchant.

The plate-protecting photoresist may be left unremoved even after the recesses 4a and 4b are provided. It is thereby possible to continuously protect the plated layers 3a and 3b even in the subsequent assembling processes. The plate-protecting photoresist may be formed on both of the plated layers 3a and 3b and left unremoved, or formed on both layers 3a and 3b but left unremoved only on the plated layer 3b.

Alternatively, such a plate-protecting photoresist may be provided not before but after etching the copper plate 1. With such a composition, it is also possible to continuously protect the plated layers 3a and 3b even in the subsequent assembling processes.

The other fabrication method will now be described with reference to FIGS. 15A through 15G.

FIGS. 15A through 15G are sectional diagrams showing the method (subtractive technique) for fabricating the substrate 20 according to the sixth embodiment of the invention. The constituting elements of FIGS. 15A to 15F that are identical to those of the drawings in the first to fifth embodiments are allotted the same reference numbers, and explanations thereof will not be repeated.

Figure 15A:
FIGS. 15A through 15G are diagrams showing the method for fabricating the substrate 20 according to the sixth embodiment.
Figure 15B:
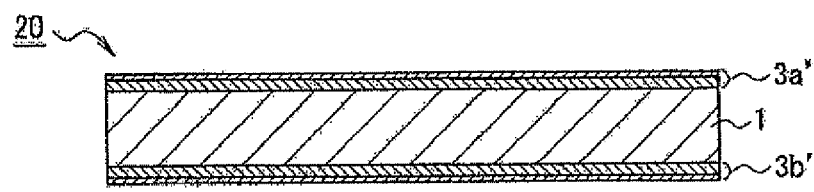

At first, referring to FIG. 15A, the copper plate 1 is prepared. Then, referring to FIG. 15B, the plated layers 5a and 3b' are provided by e.g. electrolytic plating on the respective front and rear surfaces of the copper plate 1. Then, referring to FIG. 15C, the front and rear surfaces of the copper plate 1 are coated with photoresists 7a and 7b, respectively. Thereafter, referring to FIG. 15D, the photoresists 7a and 7b are subjected to exposure and development so as to expose the regions for forming the posts, and the resist patterns 7a' and 7b' are formed on the respective front and rear surfaces of the copper plate 1 covering the other regions. Then, referring to FIG. 15E, the plated layers 3a' and 5b' are etched using the resist patterns 7a' and 7b' as a mask and removed. As a result, with reference to FIG. 15E, the patterned plated layers 3a and 3b are provided on the respective front and rear surfaces of the copper plate 1.

Figure 15C:
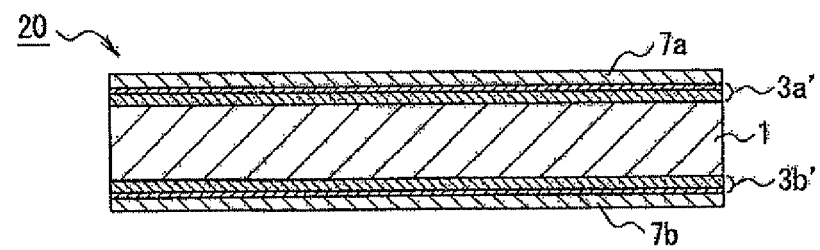
Figure 15D:
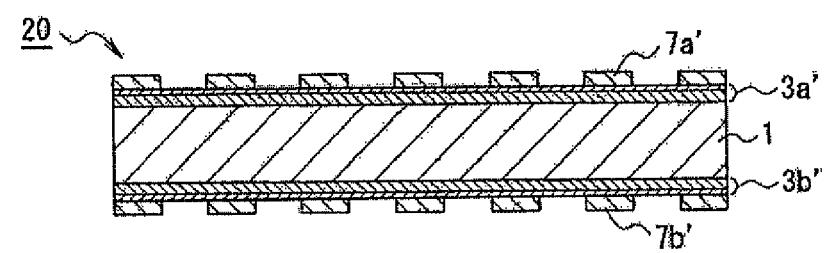
Figure 15E:
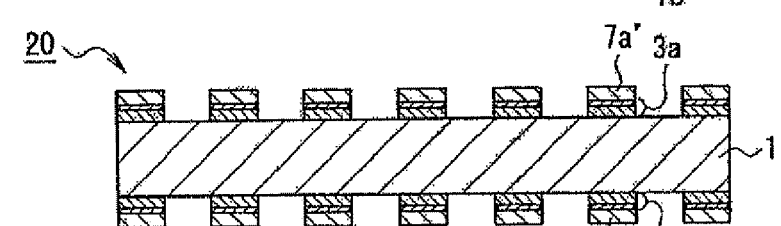
Figure 15F:
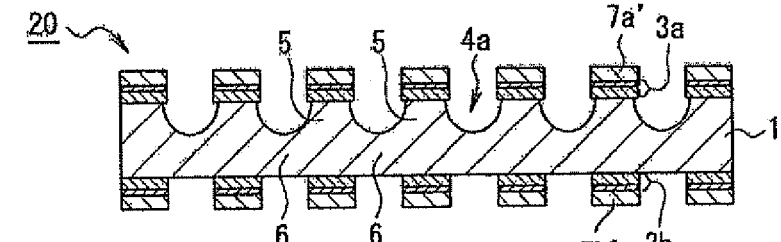

Then, referring to FIG. 15F, the copper plate 1 is half-etched from the side adjacent to the front surface using the plated layer 3a as a mask so as to form the recesses 4a on the side adjacent to front surface of the copper plate 1. In this step of FIG. 15F, the copper plate 1 is etched only from the side adjacent to the front surface, leaving the rear surface unetched. Such etching from only the side adjacent to the front surface is possible by e.g. the spray type wet etching. The etchant used in this case is the ferric chloride solution or the alkaline solution, for example, and the etchant is sprayed toward the front surface of the copper plate 1 to thereby form the recesses 4a.

The depth of the recesses provided on the surface of the copper plate 1 may be half, or more or less than half, the thickness of the thickness of, the copper plate 1. For the same reason as mentioned in the first embodiment, the substrate 20 may be rinsed after the half etching. Alternatively, after the rinsing treatment, the front and rear surfaces of the copper plate 1 (including the inner surfaces of the recesses) may be coated with an antioxidant.

Figure 15G:
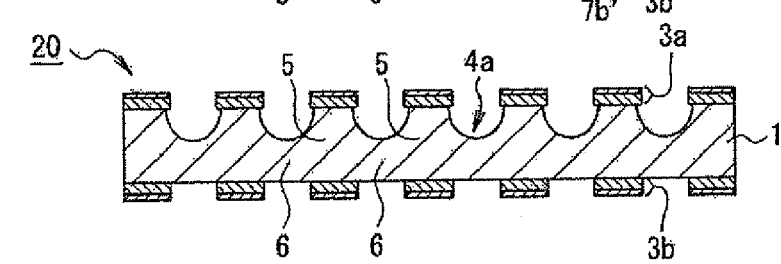

Thereafter, with reference to FIG. 15G, the resist patterns are removed from the substrate 20. This resist removal process referring to FIG. 15G is shown as an example and not essential in this embodiment. In this embodiment, the resist patterns may be left unremoved on both surfaces of the substrate 20. Alternatively, referring to FIG. 15G, the resist pattern only on the side adjacent to the front surface of the substrate 20 may be removed, and the resist pattern on the side adjacent to the rear surface may be left unremoved. Accordingly, the resist pattern can be used as a film for protecting the plated layer 3b in the subsequent assembling processes.

In the fabrication method referring to FIGS. 15A through 15G, the process of FIGS. 15C through 15E may be conducted by a physical process and not a chemical process. As in the first embodiment, the plated layers may be partially removed by sandblasting or by using a cutting instrument.

FIGS. 16A through 16D are sectional diagrams showing the method for fabricating a semiconductor device 150 (from the recognition mark processing step to the resin sealing step) according to the sixth embodiment. The constituting elements of FIGS. 16A through 16D that are identical to those of the drawings in the first to fifth embodiments are allotted the same reference numbers, and explanations thereof will not be repeated.

Figure 16A:
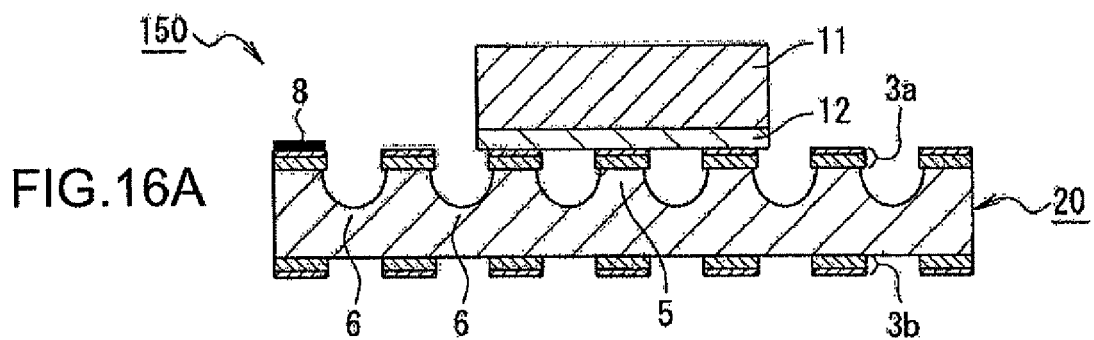
FIGS. 16A through 16D are diagrams showing a method for fabricating a semiconductor device 150 according to the sixth embodiment.

Referring to FIG. 16A, the substrate 20 produced in the method of FIGS. 14A to 14F or FIGS. 15A to 15G is first prepared, and the recognition mark 8 is provided on the surface of the substrate 20. In this case, as in the first embodiment, the recognition mark 8 is also provided by coloring the upper surface of the post 5 in a desired position by use of e.g. the inkjet technique or the laser marking technique. Then, the IC fixing region is recognized using the recognition mark 8 as a marker and the IC element 11 is aligned to the recognized IC fixing region. Then, the IC element 11 is mounted onto the plurality of posts 5 in the IC fixing region using the adhesive 12.

Figure 16B:
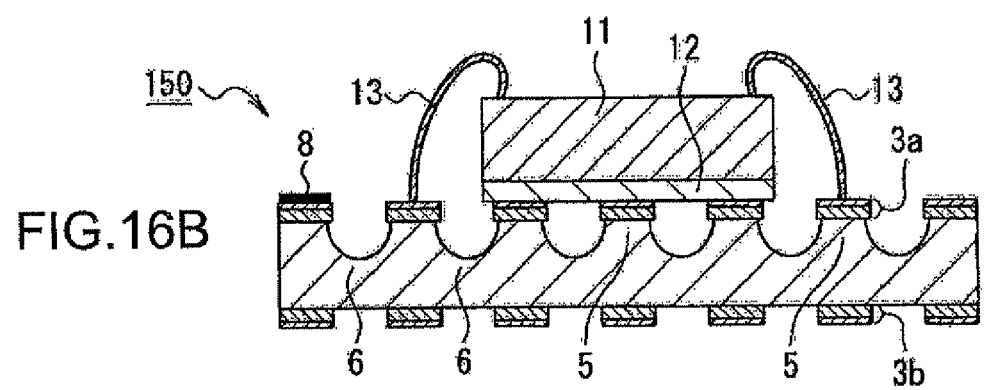

Then, referring to FIG. 16B, the upper surfaces of the posts 5 in the region other than the IC fixing region (i.e., the region not directly under the IC element) are coupled to the active surface of the IC element 11 with e.g. the gold wires 13. In this case, using the recognition mark 8 as a marker, the posts 5 that become the external terminals are recognized, and the recognized posts 5 may be coupled to ends of the gold wires 13. By this method, it is possible to correctly recognize the posts 5 that become the external terminals, out of the plurality of posts 5, and to connect the gold wires 13 to the recognized posts 5 with precision.

Figure 16C:
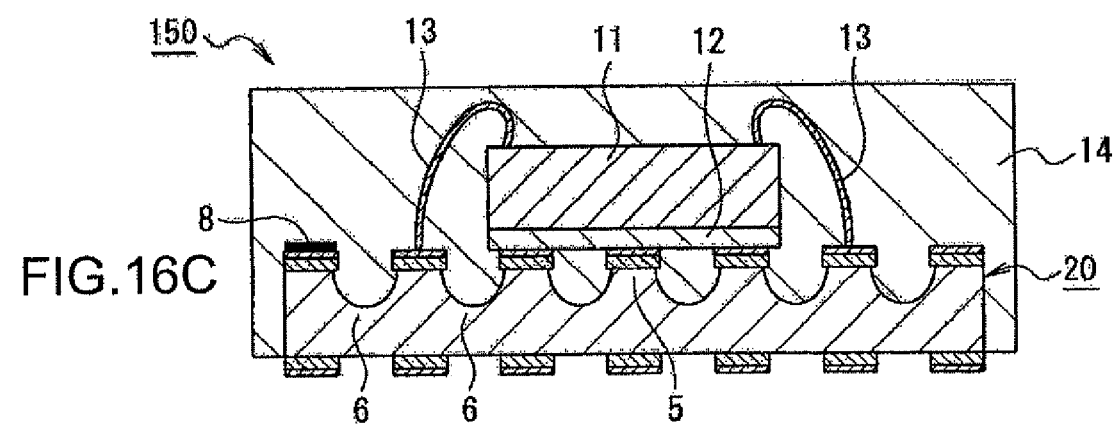

Referring to FIG. 16C, the entire upper part of the substrate 20 that includes the IC element 11, the gold wires 13, and the posts 5 are sealed with the mold resin 14. The mold resin 14 is a thermo-curing epoxy resin, for example. In this resin-sealing process, for example, the front surface of the substrate 20 including the IC element 11 is covered by a cavity, and pressure inside the cavity is reduced. The mold resin 14 is then supplied into the depressurized cavity. By this supply of resin under reduced pressure, the mold resin 14 is satisfactorily supplied and filled in the recesses 4a without the voids, with reference to FIG. 16C.

Figure 16D:
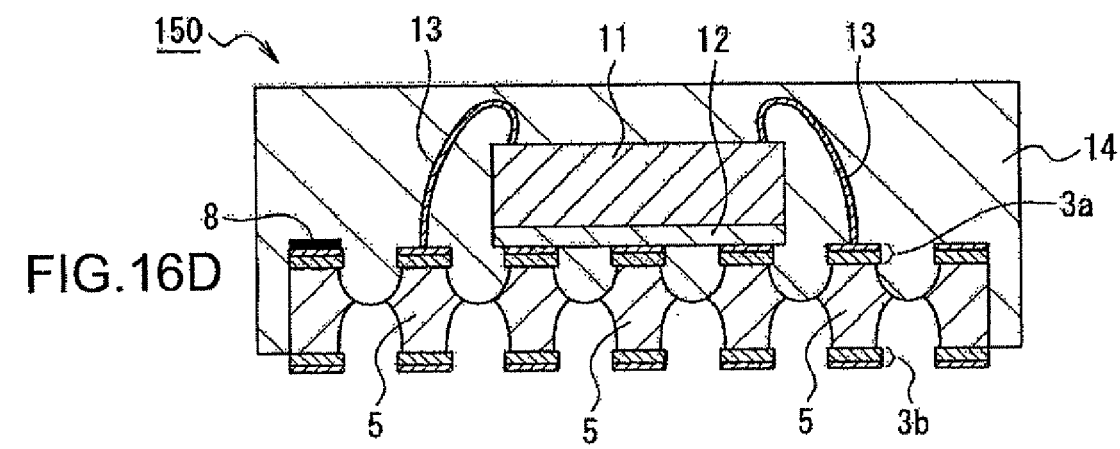

Thereafter, the joining sections 6 are removed by etching from the side adjacent to the rear surface of the substrate 20 using the plated layer 3b as a mask. Referring to FIG. 16D, the adjacent posts 5 are electrically disconnected from each other. To etch the substrate 20, the ferric chloride solution or the alkaline solution is used, for example. As a result, the posts 5 connected to the gold wires 13 can be used as the electrically independent external terminals.

If the photoresist (not shown) that is the layer for protecting the plated layer 3b is left unremoved on the rear surface of the layer 3b, this photoresist is removed after etching the joining sections.

If the plated layer 3b is an Ag plate, the Ag plate may be removed, and another plating process may be performed. That is, the Ag plate is removed, and then a different kind of plate may be reapplied as the plated layer 3b. An example of the different kind of plate is Ni/Pd/Au, Ni/Au, or solder. Such reapplication of the plated layer 3b may be conducted after the removal of the photoresist if the photoresist is formed on the rear surface of the layer 3b, or after the removal of the joining sections if the photoresist is not formed on the rear surface of the layer 3b.

Thereafter, the mold resin 14 is diced into separate pieces. This dicing process is as shown with reference to FIG. 4A or FIG. 4B, and the post 5 with the recognition mark 8 formed thereon may be cut off. Depending on the positional relation between the dicing lines and the recognition mark 8, the recognition mark 8 may or may not remain within the device 150. The semiconductor device 150 is thereby produced.

As described, according to the sixth embodiment of the invention, it is possible to use the plurality of posts 5 as the die pads or as the external terminals, as is in the first embodiment. Also, it is possible to use the plurality of posts 5 either as the die pads or the external terminals depending on the configuration and size of an IC fixing region established as desired. Accordingly, as is in the first embodiment, it is possible to commonly apply the specification of the substrate used for element mounting and as the external terminals and to reduce the costs of producing the semiconductor device.

Also, according to the sixth embodiment of the invention, the IC element 11 is recognized using the recognition mark 8 as a marker, and the IC element 11 is aligned to the recognized IC fixing region, as is in the first embodiment. Therefore, it is possible to align the IC element 11 to the IC fixing region with precision and to mount the IC element 11 onto the posts 5 in the IC fixing region with minor misalignment.

Moreover, according to the sixth embodiment of the invention, the posts 5 are pressed toward the mold resin 14 and prevented from falling from the mold resin 14 because of the following two countermeasures against falling: (a) curved configuration of the side surface of each post 5, and (b) anchor effect by the plated layer 3a and the post 5 forming the letter T.

The corresponding relations in the sixth embodiment are the same as those in the first embodiment.

7. Seventh Embodiment

Explained in the previous first to sixth embodiments is a case in which the IC element 11 is mounted on the substrate 10 or 20 having the plurality of posts 5. However, in the embodiments of the invention, the elements to be mounted on the substrate 10 or 20 are not limited to the IC element 11 but may be passive components such as resistive elements and capacitive elements.

Figure 17A:
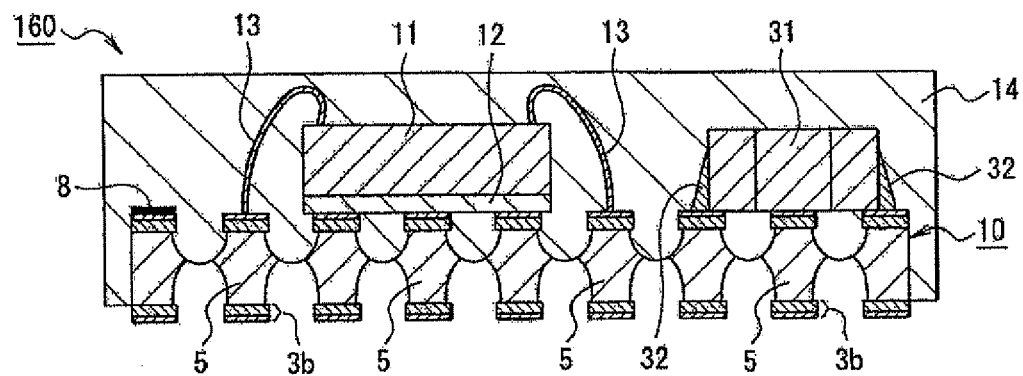
FIGS. 17A through 17C are diagrams exemplarily showing the compositions of semiconductor devices 160, 170, and 180 according to a seventh embodiment.
Figure 17B:
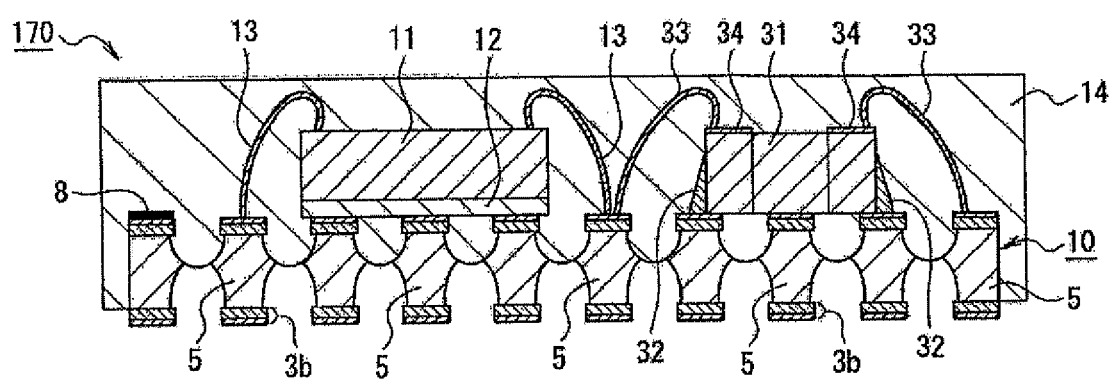
Figure 17C:
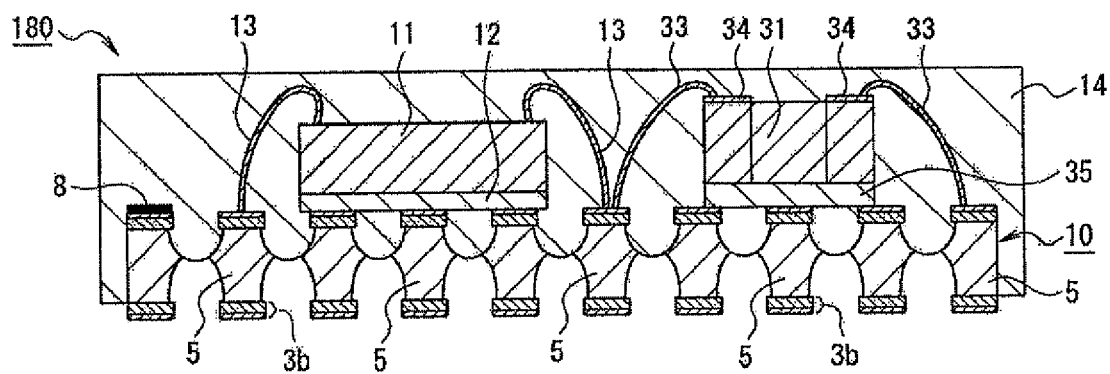

FIGS. 17A through 17C are sectional diagrams exemplarily showing the compositions of semiconductor devices 160, 170, and 180 according to the seventh embodiment of the invention. The constituting elements of FIGS. 17A through 17C that are identical to those of the first to sixth embodiments are allotted the same reference numbers, and explanations thereof will not be repeated.

The semiconductor device 160 with reference to FIG. 17A is a type of device that a passive component 31 is fixed to the surfaces of the posts 5 with solders 32 and that the electrical coupling (i.e., wire connection) of the passive component 31 to the IC element 11 is conducted on the side adjacent to the motherboard (not shown). Referring to FIG. 17A, the portions on the side adjacent to the rear surfaces of the posts 5 of the semiconductor device 160 are exposed from the mold resin 14, and the side surfaces of the posts 5 are sectionally curved. A solder (32) layer is provided, for example, by coating a cream solder 32 on the surfaces of the posts 5 before mounting the passive component 31 and by subjecting the cream solder 32 to a reflow process at a time of mounting the passive component 31.

The semiconductor device 170 with reference to FIG. 17B is a type of device that the passive component 31 is fixed to the posts 5 with the solders 32 and that the electrical coupling of the passive component 31 to the IC element 11 is conducted using e.g. gold wires 33. With the semiconductor device 170, also, the portions on the side adjacent to the rear surfaces of the posts 5 are exposed from the mold resin 14, and that the side surfaces of the posts 5 are sectionally curved. Also, the surface of a terminal section 34 of the passive component 31 is plated with Au or Ag, and the terminal section 34 and the surfaces of the posts 5 are coupled with the gold wires 33. Further, some gold wires 13 connected to the IC element 11 and some gold wires 33 connected to the passive component 31 are coupled to the surface of the same post 5, and the IC element 11 and the passive component 31 are electrically coupled via the gold wires 13, the post 5, and the gold wires 33.

The semiconductor device 180 with reference to FIG. 17C is a type of device that the passive component 31 is fixed to the posts 5 with an insulating resin 35 and that the passive component 31 is electrically coupled to the IC element 11 with e.g. the gold wires 33. The only difference from the semiconductor device 170 of FIG. 17B is that a bonding member bonding the passive component 31 to the posts 5 is not the solder but the insulating resin 35. The rest of the composition is the same.

As described, with the semiconductor devices 160, 170, and 180 according to the seventh embodiment of the invention, the plurality of posts 5 may be used as the die pads for mounting the IC elements 11 and the passive components 31 or as the external terminals of the IC elements 11 and the passive components 31. Also, depending on the configuration and size of the IC fixing region established as desired and on the configuration and size of a region for fixing the passive component 31, it is possible to use the plurality of posts 5 either as the die pads or the external terminals. Accordingly, as is in the first embodiment, it is also possible to commonly apply the specification of the substrate 10 and to reduce the costs of producing the semiconductor device.

Also, with the seventh embodiment of the invention, in the die attaching process, a region on which the passive component 31 should be mounted using the recognition mark 8 as a marker (hereunder referred to as predetermined region) may be recognized using the recognition mark 8 as a marker, and the passive component 31 may be aligned to the recognized predetermined region. By this method, it is possible to align the passive component 31 in the predetermined region with precision and to mount the component 31 onto the plurality of posts 5 in the predetermined region with minor misalignment. Also, in the wire bonding process, the posts that become the external terminals are recognized using the recognition mark 8 as a marker, and ends of the gold wires 13, 33 are coupled to the recognized posts 5. By such a method, it is possible to correctly recognize the posts 5, out of the plurality of posts 5, that become the external terminals and to connect the gold wires 13 and 33 to the recognized posts 5 with precision.

Moreover, according to the seventh embodiment of the invention, the posts 5 are pressed toward the mold resin 14 and prevented from falling from the mold resin 14 because of the following two countermeasures against falling: (a) curved configuration of the side surface of each post 5, and (b) anchor effect by the plated layer 3a and the post 5 forming the letter T.

In the seventh embodiment, the post 5 on which the passive component 31 is mounted corresponds to the "third metal post" of the embodiments of the invention, and the post 5 electrically coupled to the passive component 31 corresponds to the "fourth conductive member" of the embodiments of the invention. Also, the solder 32 or the gold wire 33 corresponds to the "third conductive member" of the embodiments of the invention. The other corresponding relations are the same as those in the first embodiment.

8. Eighth Embodiment

Explained in the first to seventh embodiments was a case in which the plurality of the posts 5 and the IC element 11 are electrically coupled using the gold wires 13 (i.e., by wire bonding). However, the embodiments of the invention may employ a technique other than the wire bonding technique, such as the face-down bonding. In the eighth embodiment, this process will be specifically described.

FIGS. 18A through 18E are sectional diagrams showing the method for fabricating a semiconductor device 190 according to the eighth embodiment of the invention The constituting elements of FIGS. 18A through 18E that are identical to those of the drawings explained in the first to seventh embodiments are allotted the same reference numbers, and explanations thereof will not be repeated.

Figure 18A:
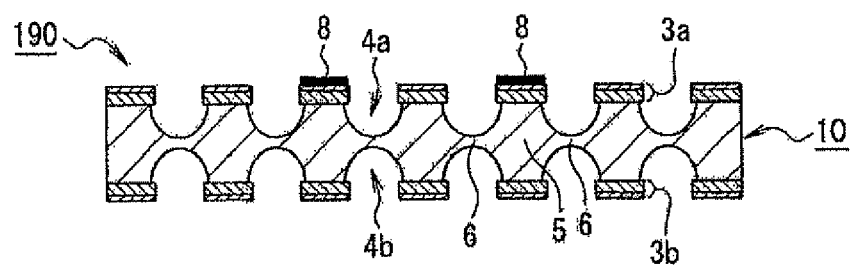
FIGS. 18A through 18E are diagrams showing a method for fabricating a semiconductor device 190 according to an eighth embodiment.

At first, referring to FIG. 18A, the substrate 10 produced by the method of FIGS. 1A to 1F or 2A to 2G is prepared, and the recognition marks 8 are provided on the surface of the substrate 10. In this embodiment, as in the first embodiment, the recognition marks 8 are provided also by coloring the upper surfaces of the posts 5 in desired positions using the inkjet technique or the laser marking technique. Compared to the wire bonding technique, the face-down bonding technique requires higher precision in the alignment of an IC element 41 on the substrate 10. Therefore, it is suggested, for example, that two or more recognition marks 8 be provided per each IC fixing region.

Figure 18B:
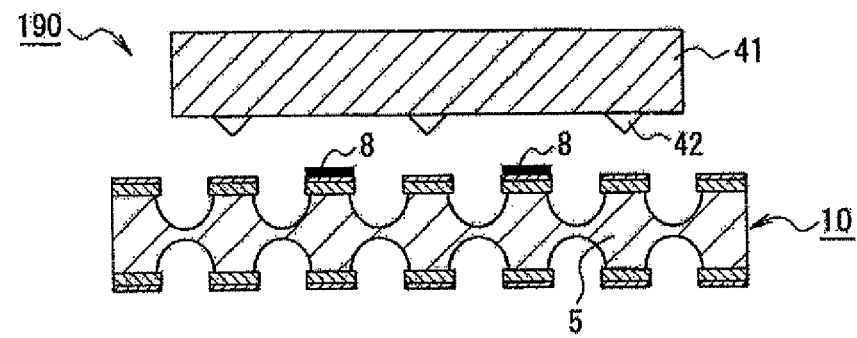
Figure 18C:
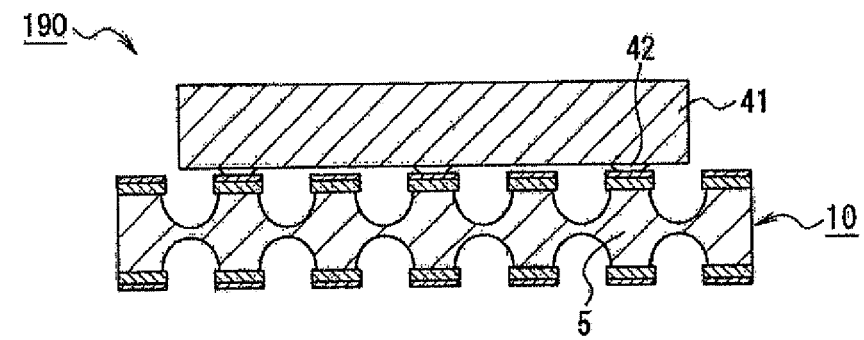
Figure 18D:
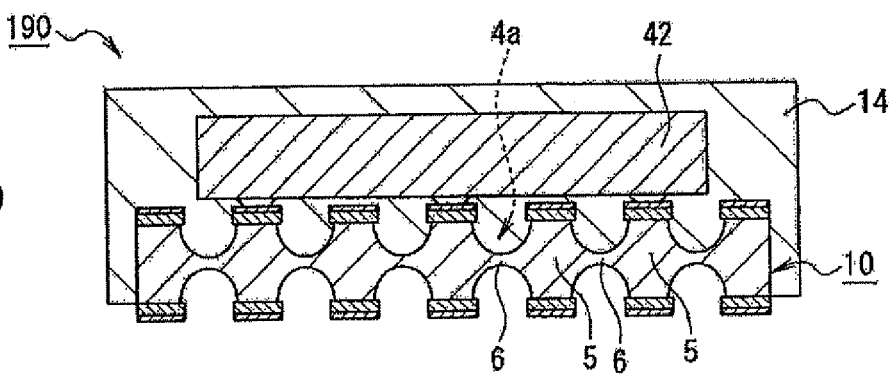
Figure 18E:
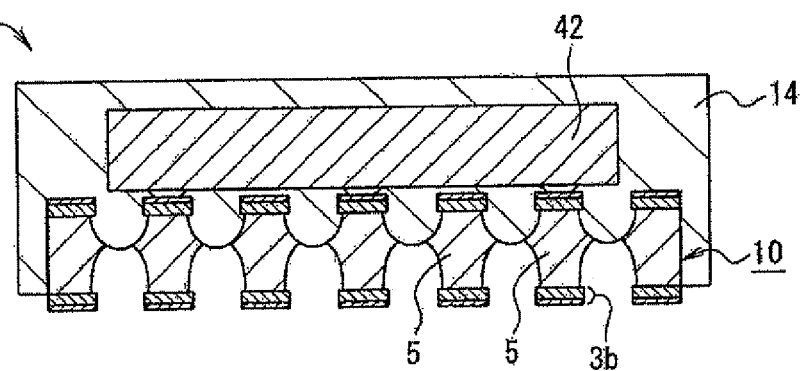
Figure 20A:
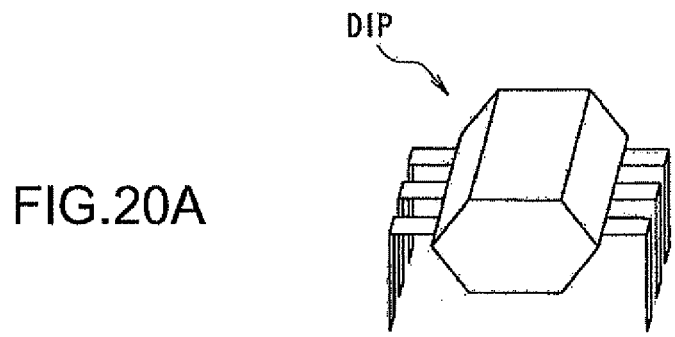
FIGS. 20A through 20D are diagrams showing examples of the related art.
Figure 20B:
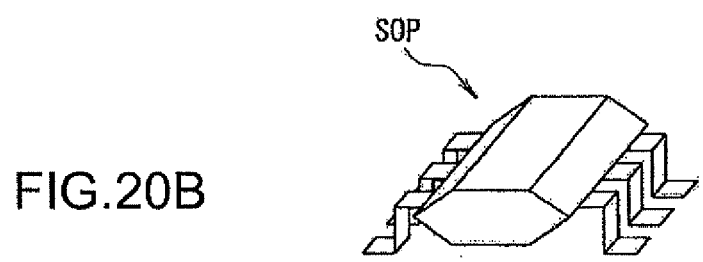
Figure 20C:
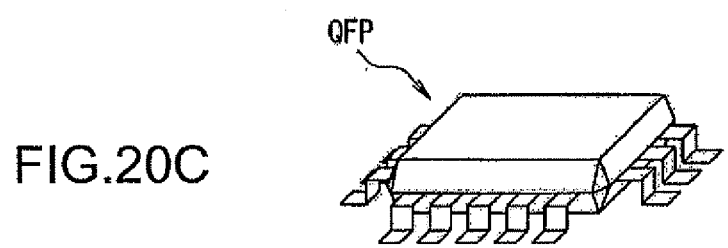
Figure 20D:
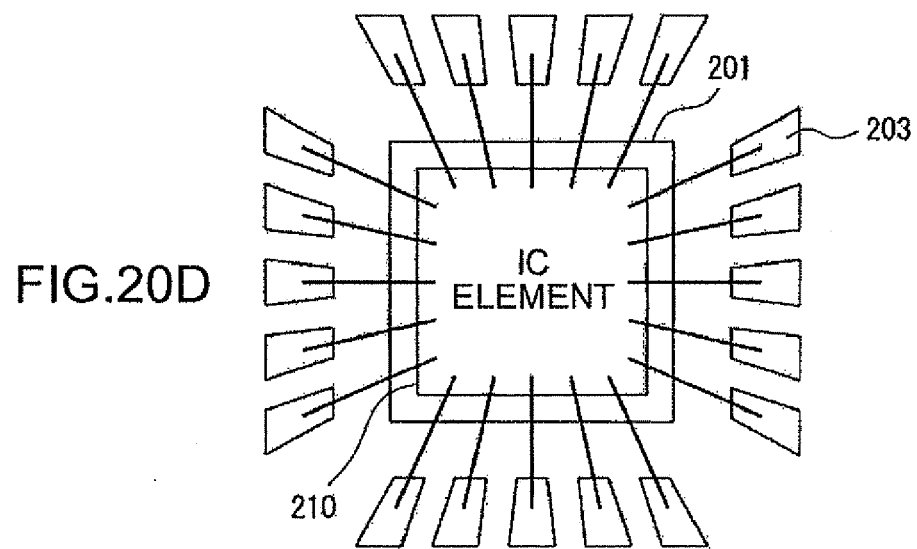
Figure 21A:
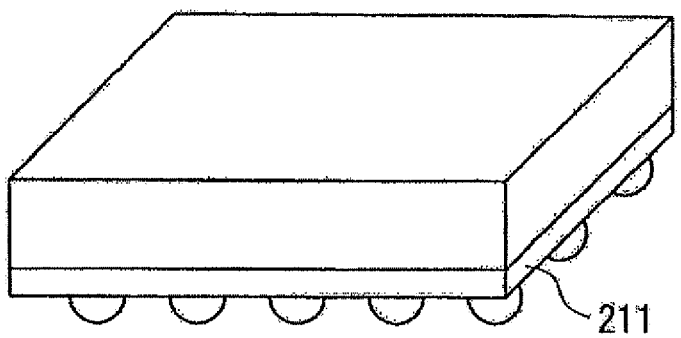
FIGS. 21A and 21B are diagrams showing examples of the related art.
Figure 21B:
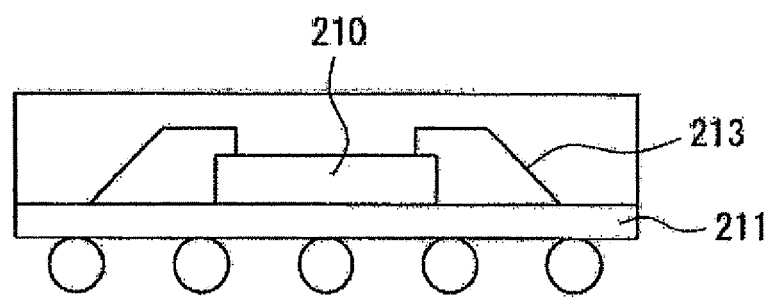
Figure 22A:
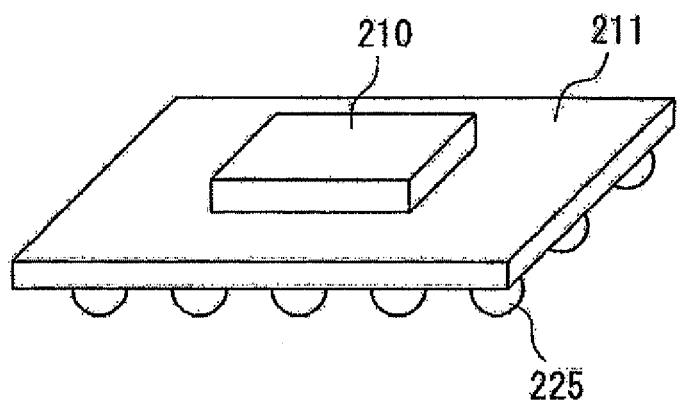
FIGS. 22A and 22B are diagrams showing examples of the related art.
Figure 22B:
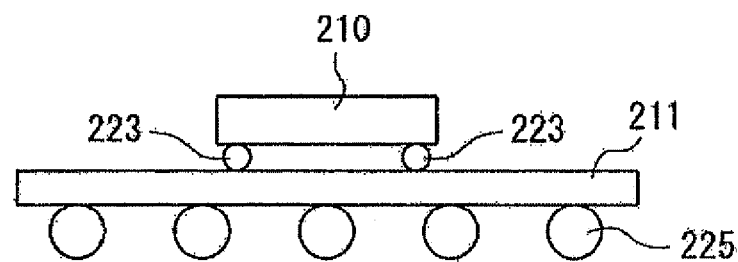
Figure 23A:
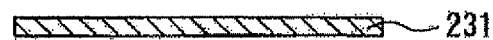
FIGS. 23A through 23I are diagrams showing examples of the related art.
Figure 23B:
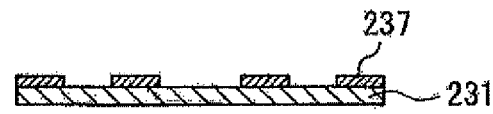
Figure 23C:
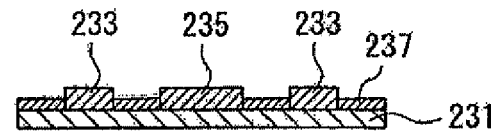
Figure 23D:
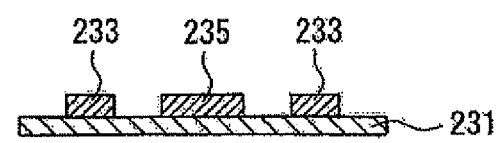
Figure 23E:
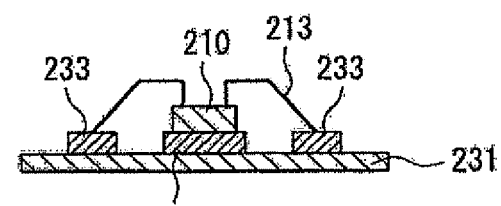
Figure 23F:
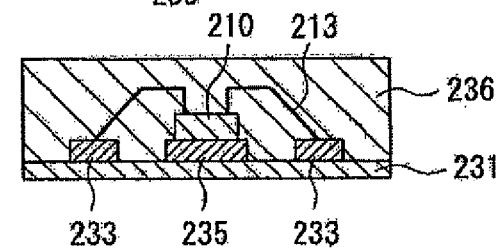
Figure 23G:
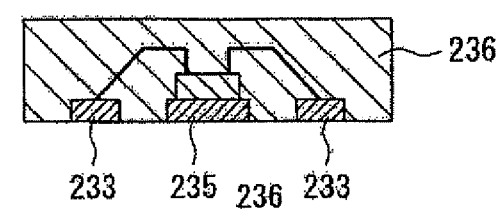
Figure 23H:
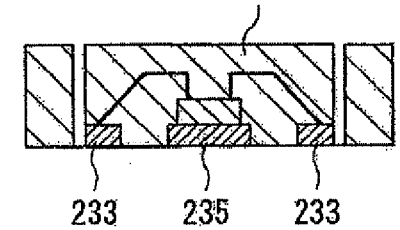
Figure 23I:
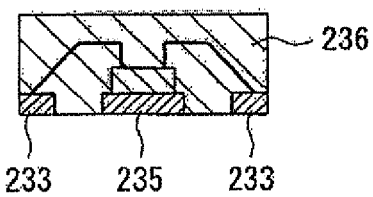

Then, referring to FIG. 18B, the IC fixing region is recognized using the recognition marks 8 as a marker in a state that the active surface of the IC element 41 is facing the substrate 10, and the IC element 41 is aligned to the recognized IC fixing region. Then, referring to FIG. 18C, while aligned to the IC fixing region, the IC element 41 is pressed toward the substrate 10, and a plurality of electrodes 42 provided on the active surface of the IC element 41 are bonded to the upper surfaces of the plurality of corresponding posts 5. The electrodes 42 are stud bumps made of gold, for example, and the layout interval (pitch) between the stud bumps is designed to become an integral multiplication of the pitch between the posts 5. Accordingly, the IC element 41 is mounted onto the substrate 10, and the electrodes 42 of the IC element 41 and the posts 5 are electrically coupled. The electrodes 42 may be electrolytically-plated gold bumps or solder bumps.

Then, referring to FIG. 16D, the entire upper part of the substrate 10 containing the IC element 41 is sealed with the mold resin 14. The mold resin 14 is a thermo-curing epoxy resin, for example. In this resin-sealing process, for example, the side adjacent to the front surface of the substrate 10 containing the IC element 11 is covered by a cavity. Then, pressure inside the cavity is reduced, and the mold resin 14 is supplied into the depressurized cavity. As a result, the mold resin 14 is satisfactorily supplied and filled in the cavity, and the recesses 4a are filled with the mold resin 14 without the voids.

As described, the joining sections 6 joining the posts 5 together are removed by etching from the side adjacent to the rear surface of the substrate 10. Thus, referring to FIG. 16E, the adjacent posts 5 are electrically disconnected from each other, and the posts 5 can be used as the electrically independent external terminals. Thereafter, the mold resin 14 is diced into separate pieces. This dicing process is the same as shown with reference to FIG. 4A or 4B, and the posts 5 with the recognition mark 8 formed thereon may be cut off. The semiconductor device 190 is thereby produced.

Therefore, according to the eighth embodiment of the invention, it is possible, as is by the wire bonding technique, to use the plurality of posts 5 as the die pads or as the external terminals depending on the configuration and size of an IC fixing region established as desired. Accordingly, it is possible to commonly apply the specification of the substrate 10 used for element mounting and as the external terminals and to reduce the costs of producing the semiconductor device, as is in the first embodiment.

Also, in the eighth embodiment of the invention, the IC fixing region is recognized using the recognition marks 8 as a marker, and the IC element 41 is aligned to the recognized IC fixing region, as is in the first embodiment. Therefore, it is possible to align the IC element 41 to the IC fixing region with precision and to mount the IC element 41 onto the posts 5 in the IC fixing region with minor misalignment.

Moreover, according to the eighth embodiment of the invention, the posts 5 are pressed toward the mold resin 14 and prevented from falling from the mold resin 14 because of the following two countermeasures against falling: (a) curved configuration of the side surface of each post 5, and (b) anchor effect by the plated layer 3a and the post 5 forming the letter T.

In the eighth embodiment, each electrode 42 corresponds to the "first conductive member" of the embodiments of the invention. The other corresponding relations are the same as those in the first embodiment.

Explained in the first to eighth embodiments is a case in which the configuration in sectional view (hereunder referred to as sectional configuration) of each of the recesses 4a and 4b provided on the substrate 10 is bowl shaped. However, the recesses 4a and 4b may take other sectional configurations. For example, referring to FIGS. 19A through 19E, each of the recesses 4a and 4b may take the form of an ellipse that lies flat. In this case, the side surface of each post 5 facing each of the recesses 4a and 4b has a constricted configuration.

Having such a structure, with reference to FIG. 19D, the constricted configuration catches the mold resin 14 when resin-sealing the IC element 11 and portions on the side adjacent to the surface of the substrate 10. Therefore, in the process of FIG. 10D and processes thereafter, the anchor effect is produced due to the constriction, and the posts 5 are more firmly prevented from falling from the mold resin 14.

Moreover, it is possible to form the constricted configuration shown in FIGS. 19A to 19E by e.g. the spray type wet etching. The spraying process promotes the etching in the depth direction by setting the spraying angle of the etchant perpendicular to the surface of the copper plate, and in the lateral direction (i.e., side etching) by setting the angle diagonal to the surface of the copper plate. Furthermore, by increasing the spraying pressure of the etchant, the etching speed may increase. Therefore, it is possible to form the side surface of each post 5 into the sectionally constricted configuration by, for example, spray etching the copper plate and by varying the spraying pressure during the etching when necessary.

What is claimed is:

1. A semiconductor device, comprising:
   a plurality of metal posts that are aligned in a longitudinal direction and a lateral direction in plan view, each of the plurality of metal posts having a first surface and a second surface facing an opposite direction to the first surface, the plurality of metal posts having a first metal post and a second metal post;
   a bare chip that is fixed on the first surface of the first metal post;
   a first conductive member that couples the first surface of the second metal post to a pad terminal of the bare chip; and
   a first resin that seals the bare chip, the first conductive member, and a part of the plurality of metal posts,
   wherein the plurality of metal posts are in an identical configuration in plan view;
   wherein each of the plurality of metal posts are electrically disconnected from each other;
   wherein the second surface of the plurality of metal posts is exposed from the first resin;
   wherein a side surface of each of the plurality of metal posts is cross-sectionally curved, and
   wherein each of the plurality of metal posts are made from a homogenous material comprising copper or alloy containing the majority atomic percentage of copper.

2. The semiconductor device according to claim 1, wherein each of the plurality of metal posts is cross-sectionally constricted.

3. The semiconductor device according to claim 1, further comprising:
   a first plated layer that is provided on the first surface of each of the plurality of metal posts,
   wherein the first plated layer protrudes outside the first surface.

4. The semiconductor device according to claim 1, further comprising:
   a second resin that seals a portion of the plurality of metal posts, the portion being exposed from the first resin,
   wherein each of the plurality of metal posts includes, between the first and second surfaces, a first portion having a first width and a second portion having a second width that is cross-sectionally wider than the first width; and
   wherein the second portion is cross-sectionally interposed between the first and second resins.

5. The semiconductor device according to claim 4, further comprising:
   a second plated layer that is provided on the second surface of each of the plurality of metal posts; and
   a second conductive member that is provided over a part of the second plated layer;
   wherein the second resin covers a periphery of the second plated layer, and the second conductive member covers a portion of the second resin covering the periphery of the second plated layer.

6. The semiconductor device according to claim 1, further comprising:
   a motherboard that is coupled to each of the plurality of metal posts; and
   a third resin sealing, between the first resin and the motherboard, the portion of each of the plurality of metal posts, the portion being exposed from the first resin.

7. The semiconductor device according to claim 1, further comprising:
   a third metal post and a fourth metal post that are included in the plurality of metal posts;
   a passive component that is fixed on the first surface of the third metal post; and
   a third conductive member that couples the first surface of the fourth metal post to a terminal section of the passive component, wherein the first resin seals the passive component and the third conductive member.

8. A method for fabricating a semiconductor device, comprising:
   (a) providing a plurality of metal posts aligned in a longitudinal direction and a lateral direction in view, by partially etching a metal plate from at least a first surface of a metal plate having a second surface facing an opposite direction to the first surface, wherein the etching is conducted so that the plurality of metal posts are configured identically in plan view and joined together between the first and second surfaces by joining sections, wherein each of the plurality of metal posts are electrically disconnected from each other;
   (b) fixing a bare chip on the first surface of a first metal post of the plurality of metal posts;
   (c) coupling a second metal post of the plurality of metal posts to a pad terminal of the bare chip element using a first conductive member;
   (d) sealing the bare chip, the first conductive member, and a portion of the plurality of metal posts on a side adjacent to the first surface with a first resin; and (e) removing the joining sections by etching from the second surface after the sealing of the bare chip.

9. The semiconductor device according to claim 1, wherein the first surface is couplable to the bare chip and the second surface is couplable to a motherboard.

10. The semiconductor device according to claim 3, wherein the first plated layer further comprises a plurality of layers, the plurality of layers include a first layer and a second layer, the first layer of the plurality of layers provided on the first surface of each of the plurality of metal posts and the second layer of the plurality of layers provided on the first layer of the plurality of layers.

11. The semiconductor device according to claim 10, wherein the plurality of layers further comprises a third layer that is provided on the second layer of the plurality of layers.

12. The semiconductor device according to claim 3, wherein the first layer of the plurality of layers is composed of Ni and the second layer of the plurality of layers is composed of Au.

13. The semiconductor device according to claim 11, wherein the first layer of the plurality of layers is composed of Ni, the second layer of the plurality of layers is composed of Pd and the third layer of the plurality of layers is composed of Au.

14. The method for fabricating a semiconductor device according to claim 8, wherein the plurality of metal posts further comprises:
a first plated layer that is provided on the first surface of each of the plurality of metal posts, wherein the first plated layer protrudes outside the first surface, and
wherein the first plated layer further comprises a plurality of layers, the plurality of layers include a first layer and a second layer, the first layer of the plurality of layers provided on the first surface of each of the plurality of metal posts and the second layer of the plurality of layers provided on the first layer of the plurality of layers.

15. The method for fabricating a semiconductor device according to claim 14, wherein the plurality of layers further comprises a third layer that is provided on the second layer of the plurality of layers.

16. The method for fabricating a semiconductor device according to claim 14, wherein the first layer of the plurality of layers is composed of Ni and the second layer of the plurality of layers is composed of Au.

17. The method for fabricating a semiconductor device according to claim 15, wherein the first layer of the plurality of layers is composed of Ni, the second layer of the plurality of layers is composed of Pd and the third layer of the plurality of layers is composed of Au.

* * * * *